(12) United States Patent
Chung et al.

(10) Patent No.: US 11,099,410 B2
(45) Date of Patent: Aug. 24, 2021

(54) LAYERED STRUCTURES, PRODUCTION METHODS THEREOF, AND LIQUID CRYSTAL DISPLAY INCLUDING THE SAME

(71) Applicants: SAMSUNG ELECTRONICS CO., LTD., Suwon-si (KR); Samsung Display Co., Ltd, Yongin-si (KR); SAMSUNG SDI CO., LTD., Yongin-si (KR)

(72) Inventors: Deukseok Chung, Yongin-si (KR); Shin Ae Jun, Seongnam-si (KR); Tae Won Jeong, Yongin-si (KR); Yong Seok Han, Anyang-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 425 days.

(21) Appl. No.: 15/849,994

(22) Filed: Dec. 21, 2017

(65) Prior Publication Data

US 2018/0173020 A1 Jun. 21, 2018

(30) Foreign Application Priority Data

Dec. 21, 2016 (KR) .......................... 10-2016-0175980

(51) Int. Cl.
*G02F 1/017* (2006.01)
*G02F 1/1362* (2006.01)
(Continued)

(52) U.S. Cl.
CPC ............ *G02F 1/017* (2013.01); *C09K 11/025* (2013.01); *C09K 11/623* (2013.01); *C09K 11/70* (2013.01);
(Continued)

(58) Field of Classification Search
CPC ............... G02F 1/017; G02F 1/133617; G02F 1/133533; G02F 1/136286; G02F 1/1336;
(Continued)

(56) References Cited

U.S. PATENT DOCUMENTS 9,323,127 B2 4/2016 Guo
9,354,465 B2 5/2016 Guo et al.
(Continued)

FOREIGN PATENT DOCUMENTS

CN 105062462 A 11/2015
KR 1020160060904 A 5/2016

OTHER PUBLICATIONS

Extended European Search Report dated Apr. 24, 2018, of the corresponding European Patent Application No. 17209431.0.

*Primary Examiner* — Eli D. Strah
(74) *Attorney, Agent, or Firm* — Cantor Colburn LLP

(57) ABSTRACT

A layered structure including a transparent substrate; a photoluminescent layer disposed on the transparent substrate and a pattern of a quantum dot polymer composite; and a capping layer disposed on the photoluminescent layer and including an inorganic material, a method of producing the same, a liquid crystal display including the same. The quantum dot polymer composite includes a polymer matrix; and a plurality of quantum dots in the polymer matrix, the pattern of the quantum dot polymer composite includes at least one repeating section and the repeating section includes a first section configured to emit light of a first peak wavelength, the inorganic material is disposed on at least a portion of a surface of the repeating section, and the inorganic material includes a metal oxide, a metal nitride, a metal oxynitride, a metal sulfide, or a combination thereof.

22 Claims, 6 Drawing Sheets

(51) Int. Cl.

| | |
|---|---|
| *G02F 1/1335* | (2006.01) |
| *G02F 1/13357* | (2006.01) |
| *G03F 7/00* | (2006.01) |
| *G03F 7/033* | (2006.01) |
| *G03F 7/004* | (2006.01) |
| *C09K 11/62* | (2006.01) |
| *C09K 11/70* | (2006.01) |
| *C09K 11/02* | (2006.01) |
| *B32B 37/06* | (2006.01) |
| *H01L 31/0352* | (2006.01) |

(52) U.S. Cl.
CPC .. *G02F 1/133533* (2013.01); *G02F 1/133617* (2013.01); *G02F 1/136286* (2013.01); *G03F 7/0007* (2013.01); *G03F 7/0047* (2013.01); *G03F 7/033* (2013.01); *B32B 37/06* (2013.01); *B32B 2457/20* (2013.01); *B32B 2457/202* (2013.01); *B32B 2457/206* (2013.01); *C09K 2323/00* (2020.08); *C09K 2323/03* (2020.08); *G02F 1/01791* (2021.01); *G02F 2201/50* (2013.01); *H01L 31/035209* (2013.01); *H01L 31/035218* (2013.01)

(58) Field of Classification Search
CPC ....... G02F 2201/50; G02F 2001/01791; G02F 2001/133614; G02F 1/01791; G02F 1/133614; C09K 11/025; C09K 11/70; C09K 11/623; C09K 11/703; C09K 11/02; C09K 2323/00; C09K 2323/03; G03F 7/0047; G03F 7/033; G03F 7/0007; Y10T 428/10; Y10T 428/1036; B32B 2457/202; B32B 2457/206; B32B 37/06; H01L 31/035209; H01L 31/035218
See application file for complete search history.

(56) References Cited

U.S. PATENT DOCUMENTS

| | | | |
|---|---|---|---|
| 2010/0019664 A1* | 1/2010 | Mishima | H01L 51/5268 313/504 |
| 2012/0113672 A1* | 5/2012 | Dubrow | G02B 6/0055 428/411.1 |
| 2013/0242228 A1* | 9/2013 | Park | G02F 2/02 349/61 |
| 2015/0318506 A1 | 11/2015 | Zhou et al. | |
| 2016/0070136 A1 | 3/2016 | Jang et al. | |
| 2016/0264820 A1 | 9/2016 | Kikuchi et al. | |
| 2017/0183567 A1 | 6/2017 | Zhou et al. | |
| 2018/0237690 A1* | 8/2018 | Chung | G03F 7/162 |

* cited by examiner

LAYERED STRUCTURES, PRODUCTION METHODS THEREOF, AND LIQUID CRYSTAL DISPLAY INCLUDING THE SAME

CROSS-REFERENCE TO RELATED APPLICATION

This application claims priority to Korean Patent Application No. 10-2016-0175980, filed on Dec. 21, 2016, and all the benefits accruing therefrom under 35 U.S.C. § 119, the content of which in its entirety is herein incorporated by reference.

BACKGROUND

1. Field

Layered structures, production methods thereof, and liquid crystal displays including the same are disclosed.

2. Description of the Related Art

A liquid crystal display ("LCD") that is one of a flat panel display device may include a liquid crystal panel including two substrates (e.g., a lower substrate and an upper substrate) on which a pixel electrode and a common electrode are formed, and a liquid crystal layer disposed therebetween. The lower (array) substrate may have a plurality of gate wires and data wires defining a pixel area, and may include a thin film transistor at a crossing point of two wires that may be connected with a pixel electrode of each pixel area. The upper substrate may include a color filter layer that includes patterned (red, green, and blue) absorption-type color filter sections corresponding to the pixel area. The liquid crystal display may include an optical element (e.g., polarizer) on, under and/or inside a liquid crystal panel.

SUMMARY

An embodiment provides a layered structure capable of providing a liquid crystal display having improved luminous efficiency.

An embodiment provides a method of producing the layered structure.

An embodiment provides a liquid crystal display including the layered structure.

In an embodiment, a layered structure includes
a photoluminescent layer including a pattern of a quantum dot polymer composite; and
a capping layer being disposed on the photoluminescent layer and including an inorganic material,
wherein the quantum dot polymer composite includes a polymer matrix; and a plurality of quantum dots in the polymer matrix,
wherein the pattern of the quantum dot polymer composite includes a repeating section and wherein the repeating section includes a first section configured to emit light of a first peak wavelength,
wherein the inorganic material is disposed on at least a portion of a surface of the repeating section, and
wherein the inorganic material includes a metal oxide, a metal nitride, a metal oxynitride, a metal sulfide, or a combination thereof.

The layered structure further includes a substrate (e.g., a transparent substrate) disposed on a surface of the photoluminescent layer opposite to the capping layer.

The polymer matrix may include a cross-linked polymer and a linear polymer having a carboxylic acid group-containing repeating unit.

The cross-linked polymer may include a thiol-ene resin, a cross-linked poly(meth)acrylate, a cross-linked polyurethane, a cross-linked epoxy resin, a cross-linked vinyl polymer, a cross-linked silicone resin, or a combination thereof.

The carboxylic acid group-containing repeating unit of the linear polymer may include a unit derived from a monomer including a carboxylic acid group and a carbon-carbon double bond, a unit derived from a monomer having a dianhydride moiety, or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

In some embodiments, the quantum dot does not include cadmium.

The quantum dot may have a core-shell structure.

The quantum dot may include an organic ligand on a surface of the quantum dot.

The organic ligand may include RCOOH, $RNH_2$, $R_2NH$, $R_3N$, RSH, $R_3PO$, $R_3P$, ROH, RCOOR', $RPO(OH)_2$, $R_2POOH$, wherein, R and R' are each independently a C5 to C24 substituted or unsubstituted aliphatic hydrocarbon group or a C6 to C20 substituted or unsubstituted aromatic hydrocarbon group, polymer organic ligand, or a combination thereof.

The repeating section may further include a second section configured to emit light of a second peak wavelength that is different from the first peak wavelength.

The repeating section may further include a third section configured to emit or transmit light of a third peak wavelength that is different from the first peak wavelength and the second peak wavelength.

The first peak wavelength (i.e., the first maximum peak emission wavelength) may be greater than about 580 nanometers and less than or equal to about 680 nanometers.

The second peak wavelength may be greater than about 480 nanometers and less than or equal to about 580 nanometers.

The third peak wavelength may be greater than or equal to about 380 nanometers and less than or equal to about 480 nanometers.

At least a portion of the surface of the repeating section may include (e.g., be coated with) a coating including the inorganic material. The inorganic material may have a refractive index of about 1.4 to about 3.

The inorganic material may include a silicon oxide, a silicon nitride, a silicon oxynitride, a hafnium oxide, a tantalum oxide, a titanium oxide, a zirconium oxide, a zinc oxide, a zinc sulfide, a magnesium oxide, a cesium oxide, a lanthanum oxide, an indium oxide, a niobium oxide, an aluminum oxide, or a combination thereof.

The capping layer may include a continuous (deposition) film of the inorganic material.

The capping layer may include at least two layers of the inorganic material, wherein at least two adjacent layers optionally have a different composition of an inorganic material, a different thickness, a different refractive index, a different transmittance, or a combination thereof.

The capping layer may include a first layer including a first inorganic material and having a first refractive index and a second layer including a second inorganic material and having a second refractive index, wherein the second layer is directly adjacent (or contacts) the first layer and a difference between the second refractive index and the first refractive index is at least about 0.5 (e.g., the second refractive index is at least about 0.5 less than the first refractive index).

The capping layer may include the first layer and the second layer disposed alternately.

A thickness of the first layer may be from about 3 nanometers to about 300 nanometers and a thickness of the second layer may be from about 3 nanometers to about 300 nanometers.

The thickness of the first layer may be greater than the thickness of the second layer.

The thickness of the first layer may be smaller than the thickness of the second layer.

The first inorganic material may have a lower refractive index than the second inorganic material and the first inorganic material may include a silicon oxide.

The second inorganic material may include a hafnium oxide, a tantalum oxide, a titanium oxide, a zirconium oxide, a magnesium oxide, a cesium oxide, a lanthanum oxide, an indium oxide, a niobium oxide, an aluminum oxide, a silicon nitride, or a combination thereof.

A thickness of the capping layer may be greater than or equal to about 100 nanometers and less than or equal to about 3000 nanometers.

The capping layer may have a transmittance of greater than or equal to about 90% for light having a wavelength of about 380 nanometers to about 520 nanometers.

The layered structure may further include an overcoat including an organic polymer, wherein the overcoat is on the capping layer.

In an embodiment, a method of producing the layered structure includes applying a composition including a plurality of quantum dots, a photopolymerizable monomer including at least two polymerizable moieties, a linear polymer comprising a carboxylic acid group-containing repeating unit (e.g., a carboxylic acid linear polymer), a photoinitiator, and an organic solvent, on a transparent substrate to form a film;

exposing a predetermined region of the formed film to light (e.g., having a wavelength of less than about 410 nm) to polymerize and cross-link in the exposed predetermined region and to form a quantum dot polymer composite dispersed in a polymer matrix;

removing an unexposed region from the film using an alkali aqueous solution to obtain a quantum dot-polymer composite pattern;

forming a capping layer including an inorganic material on the quantum dot-polymer composite pattern; and heating the quantum dot-polymer composite pattern at a temperature of greater than or equal to about 160° C. after forming the capping layer including the inorganic material.

The light may have a wavelength of less than about 410 nanometers.

The method may further include heating the exposed predetermined region at a temperature of greater than or equal to (the organic solvent's boiling point −10° C.) and less than about 160° C. before forming the capping layer.

In the method, the series of the processes may be repeated at least twice.

The forming of the capping layer including the inorganic material may be performed by physical vapor deposition, chemical vapor deposition, or a combination thereof.

In an embodiment, a liquid crystal display includes a liquid crystal panel including a lower substrate, an upper substrate, a liquid crystal layer disposed between the upper and lower substrates, and the aforementioned layered structure used or included as a photoluminescent color filter layer provided on the upper substrate;

a polarizer disposed under the lower substrate; and a backlight unit disposed under the polarizer and emitting blue light.

The liquid crystal display may further include an optical element between the photoluminescent color filter layer and the liquid crystal layer.

The optical element may include at least one of a polarizer and a coating that controls a refractive index without a polarization function.

In the liquid crystal display, the repeating section may further comprise a second section configured to emit light of a second peak wavelength that is different from the first peak wavelength.

The liquid crystal display may further include a blue light blocking element (e.g., a blue cut filter) disposed (e.g., on a region corresponding to the first and/or second section(s)) on the repeating section.

In case of environmentally-friendly cadmium-free quantum dots, ligands of the quantum dots may be detached by oxidation or heat even in a relatively low temperature thermal process of less than or equal to about 200° C. and thus luminous efficiency may be sharply decreased and brightness thereof may decrease during the production of a display device. According to an embodiment, it may be possible to improve luminous efficiency that may be otherwise deteriorated by such a thermal process and to prevent deterioration of light characteristics of quantum dots at a relatively high temperature of about 180° C. to about 230° C.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
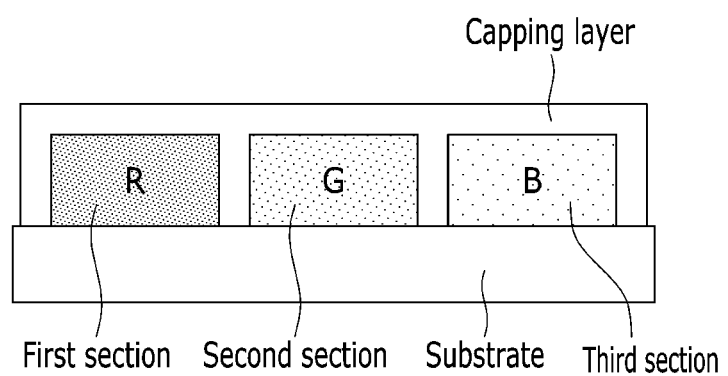
FIG. 1 is a schematic view showing an embodiment of a cross-section of a layered structure.

Advantages and characteristics of this disclosure, and a method for achieving the same, will become evident referring to the following example embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as being limited to "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "hydrophobic moiety" refers to a moiety providing the corresponding compound with a tendency to be agglomerated in an aqueous solution and to repel water. For example, the hydrophobic moiety may include an aliphatic hydrocarbon group having a carbon number of 1 or greater (at least two) (alkyl, alkenyl, alkynyl, etc.), an aromatic hydrocarbon group having a carbon number of 6 or greater (phenyl, naphthyl, aralkyl group, etc.), or an alicyclic hydrocarbon group having a carbon number of 5 or greater. The hydrophobic moiety is not mixed with the ambient medium since it is substantially lacking of capability of making a hydrogen bond with the ambient medium, or since the polarity thereof is not matched with that of the ambient medium.

As used herein, the term "visible light" refers to light having a wavelength of about 390 nanometers (nm) to about 700 nm. As used herein, the term ultraviolet ("UV") may refer to light having a wavelength of greater than or equal to about 200 nm and less than about 390 nm.

As used herein, a (blue) photoconversion efficiency refers to a ratio of emission light relative to incident light (e.g., blue light). For example, a blue photoconversion efficiency is a ratio of a light emission dose of a quantum dot polymer composite relative to absorbed light dose of the quantum dot polymer composite from excited light (i.e., blue light). The total light dose (B) of excited light may be obtained by integrating its PL spectrum, the PL spectrum of the quantum dot polymer composite film is measured, a dose (A) of light in a green or red wavelength region emitted from the quantum dot polymer composite film and a dose (B') of blue light may be obtained, and a blue photoconversion efficiency may be obtained by the following equation:

$$A/(B-B') \times 100\% = \text{photoconversion efficiency (\%)}$$

As used herein, the term "dispersion" refers to dispersion wherein a dispersed phase includes a solid and a continuous medium includes liquid. As used herein, "dispersion" may refer to colloidal dispersion wherein dispersion or dispersed phase has a dimension of about 1 nm to about 1 micrometer (μm).

As used herein, "Group" refers to a Group of Periodic Table.

As used herein, "Group II" refers to Group IIA and a Group IIB, and examples of the Group II metal may include Cd, Zn, Hg, and Mg, but are not limited thereto.

"Group III" refers to a Group IIIA and a Group IIIB, and examples of the Group III metal may include Al, In, Ga, and TI, but are not limited thereto.

"Group IV" refers to a Group IVA and a Group IVB, and examples of the Group IV metal may include Si, Ge, and Sn but are not limited thereto. As used herein, the term "a metal" may include a semi-metal such as Si.

"Group I" refers to a Group IA and a Group IB, and may include Li, Na, K, Rb, and Cs but are not limited thereto.

"Group V" refers to Group VA and may include nitrogen, phosphorus, arsenic, antimony, and bismuth but is not limited thereto.

"Group VI" refers to Group VIA and may include sulfur, selenium, and tellurium, but is not limited thereto.

"Substituted" means that the compound or group is substituted with at least one (e.g., 1, 2, 3, or 4) substituent independently selected from a hydroxyl (—OH), a C1-9 alkoxy, a C1-9 haloalkoxy, an oxo (=O), a nitro (—NO$_2$), a cyano (—CN), an amino (—NH2), an azido (—N3), an amidino (—C(=NH)NH2), a hydrazino (—NHNH2), a hydrazono (=N—NH2), a carbonyl (—C(=O)—), a carbamoyl group (—C(O)NH2), a sulfonyl (—S(=O)2—), a thiol (—SH), a thiocyano (—SCN), a tosyl (CH3C6H4SO2—), a carboxylic acid (—C)=O)OH), a carboxylic C1 to C6 alkyl ester (—C)=O)OR wherein R is a C1 to C6 alkyl group), a carboxylic acid salt (—C)=O) OM) wherein M is an organic or inorganic cation, a sulfonic acid (—SO3H2), a sulfonic mono- or dibasic salt (—SO3MH or —SO3M2 wherein M is an organic or inorganic cation), a phosphoric acid (—PO3H2), a phosphoric acid mono- or dibasic salt (—PO3MH or —PO3M2 wherein M is an organic or inorganic cation), a C1 to C12 alkyl, a C3 to C12 cycloalkyl, a C2 to C12 alkenyl, a C5 to C12 cycloalkenyl, a C2 to C12 alkynyl, a C6 to C12 aryl, a C7 to C13 arylalkylene, a C4 to C12 heterocycloalkyl, and a C3 to C12 heteroaryl instead of hydrogen, provided that the substituted atom's normal valence is not exceeded.

A liquid crystal display may have decreased luminous efficiency for example by a color filter layer and accordingly technologies for improving luminous efficiency of a liquid crystal display are desired.

In an embodiment, a layered structure includes a photoluminescent layer having a pattern of a quantum dot polymer composite; and a capping layer disposed on the photoluminescent layer and including an inorganic material. The layered structure further includes a substrate (e.g., a transparent substrate), on which the photoluminescent layer is disposed. The quantum dot polymer composite includes a plurality of quantum dots dispersed in a polymer matrix and the pattern of the quantum dot polymer composite includes at least one repeating section, and the repeating section includes a first section configured to emit light of a first peak wavelength. The repeating section may further include a second section configured to emit light of a second peak wavelength that is different from the first peak wavelength. The repeating section may further include a third section configured to emit or transmit light of a third peak wavelength that is different from the first peak wavelength and the second peak wavelength. For example, the first peak wavelength (e.g. maximum light emitting peak wavelength) may be from about 580 nm to about 650 nm (e.g., about 620 nm to about 650 nm). The first section may be an R section to emit red light, but is not limited thereto. The second peak wavelength (e.g. maximum light emitting peak wavelength) may be from about 480 nm to about 580 nm (e.g., about 500 nm to about 560 nm). The second section may be a G section to emit green light, but is not limited thereto. The third peak wavelength (e.g. maximum light emitting peak wavelength) may be from about 380 nm to about 480 nm (e.g., about 440 nm to about 480 nm). The third section may emit/transmit blue light, but is not limited thereto.

The inorganic material may be disposed on at least a portion of a surface of the repeating section. The inorganic material may include a metal oxide, a metal nitride, a metal oxynitride, a metal sulfide, or a combination thereof.

The (transparent) substrate may be a substrate including an insulation material. The substrate may include glass; various polymer (e.g., polyester such as polyethylene terephthalate ("PET") and polyethylene naphthalate ("PEN"), poly(meth)acrylate, polycarbonate, polyimide, polyimideamide, or the like); polysiloxane (e.g. polydimethylsiloxane ("PDMS")); an inorganic material such as Al$_2$O$_3$ or ZnO; or a combination thereof, but is not limited thereto. Herein, the term "transparent" refers to light transmittance of greater than or equal to about 85%, for example, greater than or equal to about 88%, greater than or equal to about 90%, greater than or equal to about 95%, greater than or equal to about 97%, or greater than or equal to about 99% for light having a predetermined wavelength. The predetermined wavelength may be from about 380 nm to about 780 nm. The predetermined wavelength may be determined considering the light emitted from each of the sections (e.g., red, green or blue light). A thickness of the (transparent) substrate may be appropriately selected considering a substrate material but is not particularly limited. The substrate may have flexibility.

The photoluminescent layer disposed on the transparent substrate includes a pattern of a quantum dot polymer composite including a plurality of quantum dots dispersed in a polymer matrix.

The polymer matrix may include a cross-linked polymer; and linear polymer having a carboxylic acid group-containing repeating unit. The cross-linked polymer may be a polymer cross-linked by light.

The cross-linked polymer may include a thiol-ene resin, a cross-linked poly(meth)acrylate, a cross-linked polyurethane, a cross-linked epoxy resin, a cross-linked vinyl polymer, a cross-linked silicone resin, or a combination thereof. The cross-linked polymer may be a copolymer. The cross-linked polymer may be a polymerization product of a photopolymerizable compound (e.g., a monomer or an oligomer) having one or more, for example, two, three, four, five, six, or more photopolymerizable functional groups (e.g., carbon-carbon double bonds such as (meth)acrylate groups or vinyl groups, epoxy groups, etc.). The photopolymerizable compound may be a generally-used photopolymerizable monomer or oligomer in a photosensitive resin composition.

In an embodiment, the photopolymerizable compound may include an ethylenic unsaturated monomer such as a (meth) acrylate monomer or a vinyl monomer; a reactive oligomer having two or more photopolymerizable moieties (e.g., ethylene oligomer, alkylene oxide oligomer, or the like having epoxy groups, vinyl groups, etc.); a copolymer of the reactive oligomer and the ethylenic unsaturated monomer; a urethane oligomer having two or more photopolymerizable moieties (e.g., (meth)acrylate moieties); a siloxane oligomer having two or more photopolymerizable moieties; or a combination thereof. The photopolymerizable compound may further include a thiol compound having at least two thiol groups at terminal ends. The photopolymerizable compound may be commercially available or may be synthesized by a known method. The cross-linked polymer may be a polymerization product of a mixture including the photopolymerizable compound.

The (meth)acrylate monomer may include a monofunctional or multi-functional ester of (meth)acrylic acid having at least one carbon-carbon double bond. The (meth)acrylate monomer may include a di(meth)acrylate compound, a tri(meth)acrylate compound, a tetra(meth)acrylate compound, a penta(meth)acrylate compound, a hexa(meth)acrylate compound, or a combination thereof. Examples of the (meth)acrylate monomer may be alkyl(meth)acrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth)acrylate, neopentylglycoldi(meth)acrylate, pentaerythritoldi(meth)acrylate, pentaerythritoltri(meth)acrylate, pentaerythritoltetra(meth)acrylate, dipentaerythritoldi(meth)acrylate, dipentaerythritoltri(meth)acrylate, dipentaerythritolpenta(meth)acrylate, dipentaerythritolhexa(meth)acrylate, bisphenol A epoxyacrylate, bisphenol A di(meth)acrylate, trimethylolpropanetri(meth)acrylate, novolac epoxy (meth)acrylate, ethyleneglycol monomethylether(meth)acrylate, tris(meth)acryloyloxyethyl phosphate, diethylene glycoldi(meth)acrylate, triethylene glycoldi(meth)acrylate, or propylene glycoldi(meth)acrylate, but are not limited thereto.

The thiol compound having at least two thiol groups at terminal ends may be a compound represented by Chemical Formula 1:

Chemical Formula 1

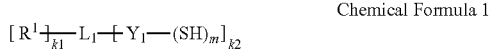

wherein, in the chemical formula, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C2 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group, provided that R and R' are not hydrogen simultaneously); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O)OR' (wherein R' is hydrogen or a C1 to C20 linear or branched alkyl group); —CN; C(=O)NRR' (wherein R and R' are independently hydrogen or a C1 to C20 linear or branched alkyl group); or —C(=O)ONRR' (wherein R and R' are independently hydrogen or a C1 to C20 linear or branched alkyl group), $L_1$ is a carbon atom, a substituted or unsubstituted C1 to C30 alkylene moiety, a substituted or unsubstituted C3 to C30 cycloalkylene moiety, a substituted or unsubstituted C6 to C30 arylene moiety, or a substituted or unsubstituted C3 to C30 heteroarylene moiety wherein at least one methylene (—$CH_2$—) of the substituted or unsubstituted C1 to C30 alkylene group may be replaced by sulfonyl (—$SO_2$—), carbonyl (CO), ether (—O—), sulfide (—S—), sulfoxide (—SO—), ester (—C(=O)O—), amide (—C(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; or a C2 to C30 alkylene group or a C3 to C30 alkenylene group wherein at least one methylene (—$CH_2$—) is replaced by a sulfonyl (—$S(=O)_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that when $Y_1$ is not a single bond, m does not exceed the valence of $Y_1$ and provided that the sum of k1 and k2 does not exceed the valence of $L_1$.

The thiol compound may include a compound represented by Chemical Formula 1-1:

Chemical Formula 1-1

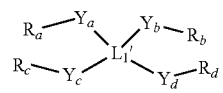

wherein, in the chemical formula, $L_1'$ is carbon, a substituted or unsubstituted C2 to C20 alkylene moiety, a substituted or unsubstituted C6 to C30 arylene moiety; a substituted or unsubstituted C3 to C30 heteroarylene moiety; a substituted or unsubstituted C3 to C30 cycloalkylene moiety; or a substituted or unsubstituted C2 to C30 heterocycloalkylene moiety, each of $Y_a$ to $Y_d$ is independently a direct bond; a substituted or unsubstituted C1 to C30 alkylene group; a substituted or unsubstituted C2 to C30 alkenylene group; or a C2 to C30 alkylene group or a C3 to C30 alkenylene group wherein at least one methylene (—$CH_2$—) is replaced by an sulfonyl (—$S(=O)_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, and each of $R_a$ to $R_d$ is independently $R^1$ of Chemical Formula 1 or SH, provided that at least two of $R_a$ to $R_d$ are SH.

The thiol compound may be a dithiol compound, a trithiol compound, a tetrathiol compound, or a combination thereof. For example, the thiolcompound may be glycol di-3-mercaptopropionate, glycol dimercapto acetate, trimethylol propane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof. A reaction between the thiol compound and the ethylenic unsaturated monomer may provide a thiol-ene resin.

The linear polymer having a carboxylic acid group-containing repeating unit (hereinafter, also referred to as a carboxylic acid polymer or a binder) may be a copolymer of monomer mixture of a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure where two aromatic rings are bound to a quaternary carbon atom that is a constituent atom of another cyclic moiety in the main chain and including a carboxylic acid group (—COON); or a combination thereof.

The carboxylic acid group-containing repeating unit may be derived form a monomer including a carboxylic acid group and a carbon-carbon double bond, a monomer having a dianhydride moiety, or a combination thereof.

Examples of the first monomer may include carboxylic acid vinyl ester compounds such as acrylic acid, methacrylic acid, maleic acid, itaconic acid, fumaric acid, 3-butenoic acid, vinyl acetate, or vinyl benzoate, but are not limited thereto. The first monomer may be at least one compound. Examples of the second monomer may be an alkenyl aromatic compound such as styrene, a-methyl styrene, vinyl toluene, or vinyl benzyl methyl ether; an unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; unsaturated carboxylic acid amino alkyl ester compound such as 2-amino ethyl acrylate, 2-amino ethyl methacrylate, 2-dimethyl amino ethyl acrylate, or 2-dimethyl amino ethyl methacrylate; unsaturated imide compound such as N-phenylmaleimide, N-benzylmaleimide, or N-alkylmaleimide; an unsaturated carboxylic acid glycidyl ester compound such as glycidyl acrylate or glycidyl methacrylate; a vinyl cyanide compound such as acrylonitrile, methacrylonitrile; or an unsaturated amide compound such as acryl amide or methacryl amide, but are not limited thereto. As the second monomer, at least one compound may be used. Examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, at least one compound may be used.

The copolymer may include a first repeating unit derived from the first monomer, a second repeating unit derived from the second monomer, and optionally a third repeating unit derived from the third monomer. In the copolymer, a content of the first repeating unit may be greater than or equal to about 10 mol %, for example, greater than or equal to about 15 mol %, greater than or equal to about 25 mol %, or greater than or equal to about 35 mol %. In the carboxylic acid polymer, a content of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the copolymer, a content of the second repeating unit may be greater than or equal to about 10 mol %, for example, greater than or equal to about 15 mol %, greater than or equal to about 25 mol %, or greater than or equal to about 35 mol %. In the binder polymer, a content of the second repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the copolymer, if it is present, a content of the third repeating unit may be greater than or equal to about 1 mol %, for example, greater than or equal to about 5 mol %, greater than or equal to about 10 mol %, or greater than or equal to about 15 mol %. In the binder polymer, a content of the third repeating unit may be less than or equal to about 20 mol %, for example, less than or equal to about 15 mol %, or less than or equal to about 10 mol %.

The copolymer may be a copolymer of (meth)acrylic acid and; at least one second/third monomer including arylalkyl (meth)acrylate, hydroxyalkyl (meth)acrylate, and styrene. For example, the binder polymer may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The carboxylic acid polymer may include a multiple aromatic ring-containing polymer. The multiple aromatic ring-containing polymer has a backbone structure where two aromatic rings are bound to a quaternary carbon atom that is a constituent atom of another cyclic moiety in the main chain (e.g., being bound to the main chain) and includes a carboxylic acid group (—COOH).

In the multiple aromatic ring-containing polymer, the backbone structure may be represented by Chemical Formula A:

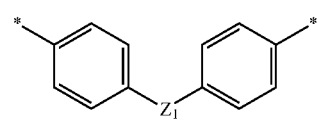

Chemical Formula A wherein, * is a portion that is linked to an adjacent atom of the main chain of the binder, and $Z_1$ is a linking moiety represented by any one of Chemical Formulae A-1 to A-6, and in Chemical Formulae A-1 to A-6, * is a portion that is linked to an aromatic moiety:

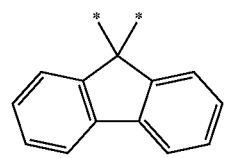

Chemical Formula A-1

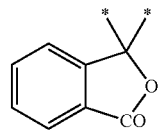

Chemical Formula A-2

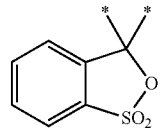

Chemical Formula A-3

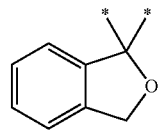

Chemical Formula A-4

-continued

Chemical Formula A-5

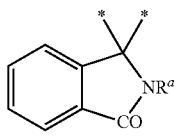

wherein, $R^a$ is a hydrogen, an ethyl group, $C_2H_4Cl$, $C_2H_4OH$, $CH_2CH=CH_2$, or a phenyl group, Chemical Formula A-6

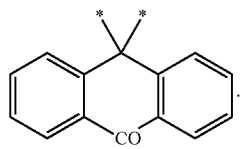

The multiple aromatic ring-containing polymer may include a repeating unit represented by Chemical Formula B:

Chemical Formula B

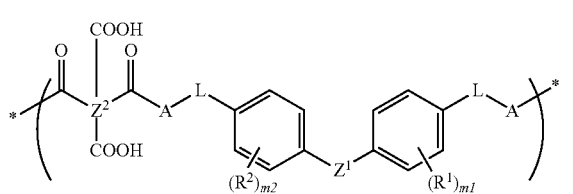

wherein $Z^1$ is a linking moiety represented by any one of Chemical Formulae A-1 to A-6, L is a direct bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, A is —NH—, —O—, or a C1 to C10 alkylene, and $Z^2$ is a C6 to C40 aromatic organic group.

each of $R^1$ and $R^2$ is independently hydrogen, a halogen, or a substituted or unsubstituted C1 to C20 alkyl group, m1 and m2 are independently an integer ranging from 0 to 4.

In Chemical Formula B, $Z^2$ may be any one of Chemical Formula [B-1], Chemical Formula [B-2] and Chemical Formula [B-3]:

Chemical Formula B-1

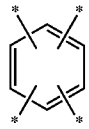

wherein * is a portion that is linked to an adjacent carbonyl carbon,

Chemical Formula B-2

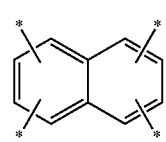

wherein * is a portion that is linked to an adjacent carbonyl carbon,

Chemical Formula B-3

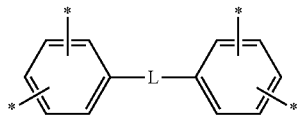

wherein * is a portion that is linked to an adjacent carbonyl carbon, L is a direct bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤q≤10), —CR$_2$— (wherein R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula C:

Chemical Formula C

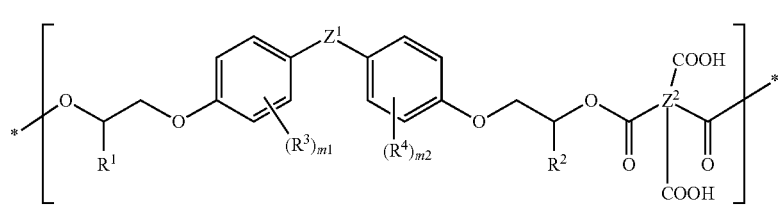

wherein each of $R^1$ and $R^2$ is independently hydrogen or a substituted or unsubstituted (meth)acryloyloxyalkyl group, each of $R^3$ and $R^4$ is independently hydrogen, a halogen, or a substituted or unsubstituted C1 to C20 alkyl group, $Z^1$ is a linking moiety represented by Chemical Formulae A-1 to A-6, $Z^2$ is an C6 to C40 aromatic organic group such as the moieties set forth above, and m1 and m2 are independently an integer ranging from 0 to 4.

In an embodiment, the multiple aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrine to obtain an epoxy compound having a fluorene moiety, and the epoxy compound is reacted with an acrylic acid to obtain a fluorenyl epoxy acrylate, which is then further reacted with biphenyldianhydride and/or phthalic anhydride. The reaction scheme may be summarized as below:

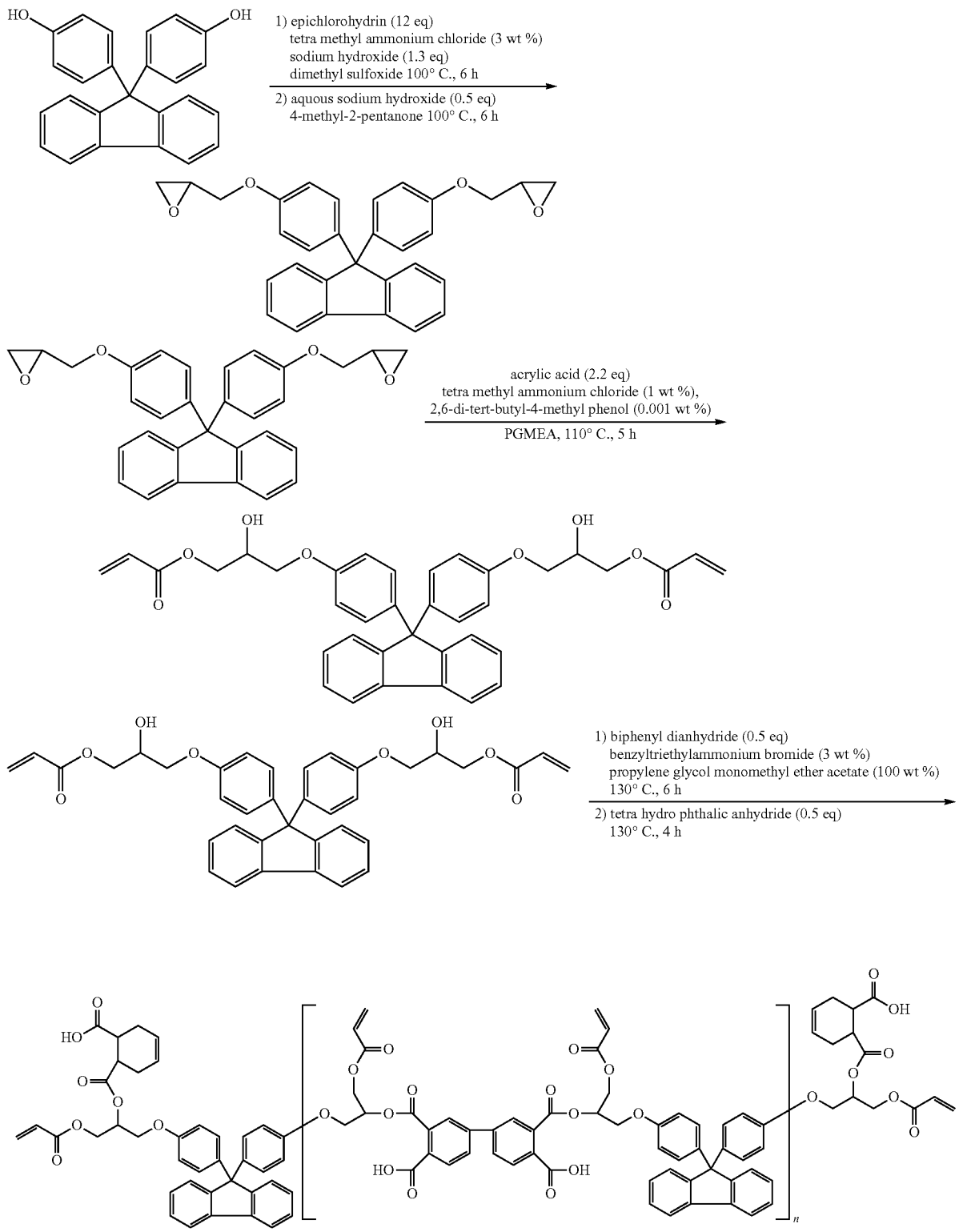

The multiple aromatic ring-containing polymer may include a functional group represented by Chemical Formula D at one or both terminal ends:

Chemical Formula D

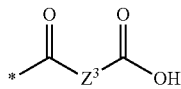

wherein, in Chemical Formula D, $Z^3$ is a moiety represented by one of Chemical Formulae D-1 to D-7:

Chemical Formula D-1

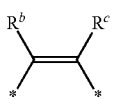

wherein, $R^b$ and $R^c$ are independently hydrogen, a substituted or unsubstituted C1 to C20 alkyl group, an ester group, or an ether group.

Chemical Formula D-2

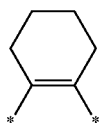

Chemical Formula D-3

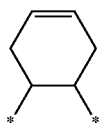

Chemical Formula D-4

Chemical Formula D-5

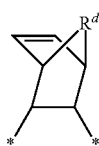

wherein, $R^d$ is O, S, NH, a substituted or unsubstituted C1 to C20 alkylene group, a C1 to C20 alkylamine group or a C2 to C20 alkenylamine group.

Chemical Formula D-6

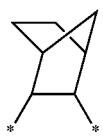

Chemical Formula D-7

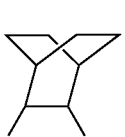

The multiple aromatic ring-containing polymer may be synthesized by a known method or is commercially available (e.g., from Nippon Steel Chemical Co., Ltd.).

The multiple aromatic ring-containing polymer may include a reaction product of a fluorene compound including 9,9-bis(4-hydroxyphenyl)fluorene, 9,9-bis(4-aminophenyl)fluorene, 9,9-bis[4-(glycidyloxy)phenyl]fluorene, and 9,9-bis[4-(2-hydroxyethoxy)phenyl]fluorene with an appropriate compound capable of reacting with the fluorene compound (e.g., an aromatic dianhydride including 9,9-bis-(3,4-dicarboxyphenyl)fluorene dianhydride, pyromellitic dianhydride ("PDMA"), biphenyltetracarboxylic dianhydride ("BPDA"), benzophenone tetracarboxylic dianhydride, and naphthalenetetracarboxylic dianhydride, a C2 to C30 diol compound, epichlorohydrin, or the like).

The fluorene compound, dianhydrides, a diol compound, and the like are commercially available, and the reaction conditions therebetween are known in the art.

An acid value of the carboxylic acid polymer may be greater than or equal to about 50 mg KOH/g. For example, the acid value of the carboxylic acid polymer may be greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. The acid value of the polymer may be for example less than or equal to about 200 mg KOH/g, for example, less than or equal to about 190 mg KOH/g, less than or equal to about 180 mg KOH/g, or less than or equal to about 160 mg KOH/g.

The quantum dot (hereinafter, referred to as a semiconductor nanocrystal) disposed (e.g., dispersed) in the polymer matrix is not particularly limited. The quantum dot may be synthesized by a known method or commercially available.

The quantum dot may include a Group II-VI compound, a Group III-V compound, a Group IV-VI compound, a Group IV element or compound, a Group compound, a Group I-II-IV-VI compound, or a combination thereof. The quantum dot may not include cadmium.

The Group II-VI compound may include a binary element compound including CdSe, CdTe, ZnS, ZnSe, ZnTe, ZnO, HgS, HgSe, HgTe, MgSe, MgS, or a mixture thereof; a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group II-VI compound may further include Group III metal.

The Group III-V compound may include a binary element compound including GaN, GaP, GaAs, GaSb, AlN, AlP, AlAs, AlSb, InN, InP, InAs, InSb, or a mixture thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; and a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (e.g., InZnP)

The Group IV-VI compound may include a binary element compound including SnS, SnSe, SnTe, PbS, PbSe, PbTe, or a mixture thereof; a ternary element compound including SnSeS, SnSeTe, SnSTe, PbSeS, PbSeTe, PbSTe, SnPbS, SnPbSe, SnPbTe, or a mixture thereof; and a quaternary element compound including SnPbSSe, SnPbSeTe, SnPbSTe, or a mixture thereof.

Examples of the Group compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto.

The Group IV element or compound may include a single-element compound including Si, Ge, or a mixture thereof; and a binary element compound including SiC, SiGe, or a mixture thereof.

The binary element compound, the ternary element compound or the quaternary element compound respectively exist in a uniform concentration in the particle or partially different concentrations in the same particle. The semiconductor nanocrystal particle may have a core-shell structure wherein a first semiconductor nanocrystal may be surrounded by a second semiconductor nanocrystal that may be different from the first semiconductor nanocrystal. The interface between the core and the shell may have a concentration gradient wherein the concentration of an element of the shell may change in a radial direction.

The semiconductor nanocrystal may include a core and a multi-layered shell surrounding the same. The multi-layered shell refers a shell including two or more layers. The adjacent layers may have the different composition from each other. At least one layer of the multi-layered shell may have a single composition, an alloying composition, or a gradient alloy composition.

In a core-shell quantum dot, a compound of the shell may have a greater energy bandgap than a compound of the core. In the core-shell quantum dot, a compound of the shell may have a smaller energy bandgap than a compound of the core. In the multi-layered shell, an outer shell of a core may have a greater energy bandgap than a shell near to a core, but is not limited thereto.

The semiconductor nanocrystal may have quantum efficiency of greater than or equal to about 10%, for example, greater than or equal to about 30%, greater than or equal to about 50%, greater than or equal to about 60%, greater than or equal to about 70%, greater than or equal to about 90%, or about 100%. For use in display devices, the semiconductor nanocrystal may have a narrower spectrum so as to realize enhanced color purity or color reproducibility. The semiconductor nanocrystal may have a full width at half maximum ("FWHM") of a light emitting wavelength spectrum of less than or equal to about 45 nm, for example less than or equal to about 40 nm, or less than or equal to about 30 nm. Within such ranges, a device including the semiconductor nanocrystal may have enhanced color purity or improved color reproducibility.

The quantum dot may have a particle size (the particle diameter for a spherical particle, and in case of a non-spherical particle, a diameter calculated from an area of a two dimensional TEM image) of about 1 nm to about 100 nm. For example, the quantum dot may have a particle size of about 1 nm to about 20 nm. The quantum dot may have a particle size of greater than or equal to about 2 nm, or greater than or equal to about 3 nm and less than or equal to about 15 nm, less than or equal to about 14 nm, less than or equal to about 13 nm, less than or equal to about 12 nm, less than or equal to about 10 nm, or less than or equal to about 9 nm.

A shape of the quantum dot is not particularly limited. In an embodiment, the quantum dot may have a spherical shape, an ellipsoidal shape, a pyramidal shape, multi-armed (multi-pod) shape, cubic shape, a polygonal shape, a nanorod, a nanotube, a nanowire, a nanofiber, a nanosheet, or a combination thereof.

The quantum dot is commercially available or may be synthesized in any method. For example, quantum dots may be a colloidal particle synthesized according to a wet chemical process. In the wet chemical process, precursors react in an organic solvent to grow nanocrystal particles, and the organic solvent or a ligand compound may coordinate to the surface of the quantum dot, controlling the growth of the nanocrystal. Examples of the organic solvent and the ligand compound are known. In the wet chemical process, the synthesized colloidal quantum dot may be collected by adding a non-solvent to a reaction solution and centrifuging a final mixture. Such a collecting process may cause removal of at least a portion of the organic materials coordinated on the surface of the quantum dot. Examples of the non-solvent may be acetone, ethanol, methanol, and the like, but are not limited thereto.

The quantum dot may have an organic ligand bound to its surface. In an embodiment, the organic ligand may have a hydrophobic moiety. The organic ligand may be RCOOH, $RNH_2$, $R_2NH$, $R_3N$, RSH, $R_3PO$, $R_3P$, ROH, RCOOR', $RPO(OH)_2$, $R_2POOH$ (wherein, R and R' are independently a C5 to C24 substituted or unsubstituted aliphatic hydrocarbon group, for example a C5 to C24 alkyl group, a C5 to C24 alkenyl group, or a C5 to C20 aromatic hydrocarbon group, for example a C6 to C20 aryl group), or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pantyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; an alkyl phosphine compound such as methyl phosphine, ethyl phosphine, propyl phosphine, butyl phosphine, pantyl phosphine, octylphosphine, dioctyl phosphine, tributylphosphine, or trioctylphosphine, a phosphine oxide compound such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide; diphenyl phosphine, triphenyl phosphine, or oxide compounds thereof; a C5 to C20 alkyl phosphonic acid; a C5 to C20 alkyl phosphinic acid such as hexylphosphinic acid, octylphosphinic acid, dodecylphosphinic acid, tetradeceylphosphinic acid, hexadecylphosphinic acid, or octadecylphosphinic acid; and the like, but are not limited thereto. The quantum dot may include the organic ligand alone or as a mixture of two or more.

The photoluminescent layer including the quantum dot-polymer composite pattern may have potential utility in a color filter of a liquid crystal display. A conventional liquid crystal display device includes a backlight unit, a liquid crystal layer, and an absorption-type color filter. When white light emitted from a backlight unit passes an absorption-type color filter, light in a predetermined wavelength may transmit and the rest of light may be absorbed, and thereby a predetermined color in each pixel may be realized. In such a liquid crystal display device, the absorption-type color filter may cause substantial luminous efficiency deterioration.

The quantum dot may have a theoretical quantum yield ("QY") of about 100%, and may emit light having high color purity (e.g., a full width at half maximum ("FWHM") of less than or equal to about 40 nm). When the photoluminescent layer having the quantum dot-polymer composite is used as a color filter, a display device having a wider viewing angle and more enhanced brightness may be realized. The color filter having the photoluminescent layer may increase luminous efficiency of a device and improve color reproducibility of a device in comparison with a color filter including light absorption-type material.

However, light emitting properties of the quantum dot may be adversely affected by heat and/or an external environment (e.g., matrix, oxygen, moisture, and the like) compared with an absorption-type color filter material. In order to realize a display device having enhanced brightness, a quantum dot-polymer matrix pattern may be required to maintain a high photoconversion efficiency, but a final quantum dot-polymer composite pattern obtained through each and every process (of preparation of a composition for forming a light-based pattern, subsequently heat-treatment, and the like) may show a significantly decreased photoconversion efficiency and/or a maintenance ratio of the remarkably-deteriorated photoconversion efficiency. Cadmium-free quantum dots (e.g., quantum dots including a Group III-V core such as InP) are known to have greatly inferior thermal/chemical stability to cadmium-based quantum dots and thus may show sharply decreased light conversion efficiency even with a heat-treating at a relatively low temperature, which may lead to decreased brightness in the display device.

However, in order to form the quantum dot-polymer composite pattern by using an alkali developing solution, the heat treatment carried out at a relatively high temperature, for example, greater than or equal to 160° C. (e.g., greater than or equal to 180° C. and even about 230° C.) may be inevitable and unavoidable. Accordingly, using a color filter with the quantum dot-polymer composite pattern has been very limited so far.

In a layered structure according to an embodiment, a capping layer including an inorganic material (e.g., essentially consisting of or consisting of an inorganic material) may be provided (for example, directly) on the photoluminescent layer (e.g., on the quantum dot polymer composite pattern or on a surface of each section in the pattern), and the foregoing structure may contribute to reduction/prevention of a decrease in the light emitting properties of the quantum dot.

Figure 2:
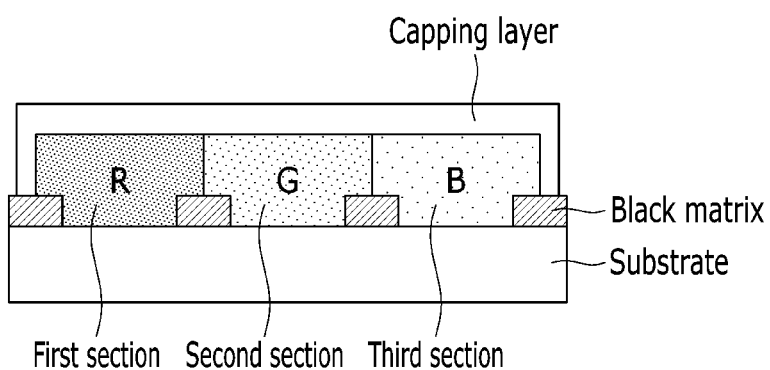
FIG. 2 is a schematic view showing an embodiment of a cross-section of a layered structure.

The capping layer may be disposed directly on the photoluminescent layer. In an embodiment, at least a portion of an exposed surface of the repeating section (e.g., first section, second section and/or third section) of the quantum dot-polymer composite pattern may be coated with the inorganic material. (See: FIGS. 1 and 2)

The inorganic material may have a refractive index of about 1.4 to about 3.0.

The inorganic material may include a silicon oxide, a silicon nitride, a silicon oxynitride, a hafnium oxide, a tantalum oxide, a titanium oxide such as titanium dioxide, a zirconium oxide, a zinc oxide, a zinc sulfide, a magnesium oxide, a cesium oxide, a lanthanum oxide, an indium oxide, a niobium oxide, an aluminum oxide, or a combination thereof. The capping layer may include a continuous film of the inorganic material.

Figure 3:
FIG. 3 is a schematic view showing an embodiment of a cross-section of a multi-layered capping layer in a layered structure.

The capping layer may include at least two (e.g., three, four, five, six, seven, or more) layers including the inorganic material. The adjacent layers 1 and 2 may be different in a composition of the inorganic material, refractive index, transmittance, a thickness, or combination thereof of the inorganic material. (See: FIG. 3)

Lamination of the capping layer with the photoluminescent layers and/or the transparent substrate may cause a stress. In the adjacent layers, controlling a composition of the inorganic material, a refractive index, a thickness, or combination thereof of each layer may allow to control (e.g., minimize) the stress. In addition, the capping layer may play a role of a dichroic filter or a dichroic reflector by adjusting a composition of the inorganic material, a refractive index, or combination thereof of each layer in the adjacent layers. By adjusting a composition, a refractive index, transmittance, a thickness, and the like of each layer, a total light transmittance (e.g., regarding excited light) may be maintained at a level of greater than or equal to about 90%, for example, greater than or equal to about 95%, or even greater than or equal to about 99% while the transmission of oxygen and moisture may be suppressed. The quantum dot included in the photoluminescent layer may emit light in all directions. When the capping layer of the layered structure plays a role of a dichroic filter and/or reflector, light of a predetermined wavelength emitted by the photoluminescent layer (e.g., green light or red light) may be mostly reflected in a predetermined direction (e.g., a front direction of a liquid crystal display device that will be described later), which may bring forth an increase in terms of light utilization efficiency.

In an embodiment, the capping layer may include a first layer including a first inorganic material and a second layer including a second inorganic material, directly contacting the first layer, and having a different refractive index from the first layer by at least about 0.5. The capping layer may include the first layer and the second layer disposed alternately.

The first inorganic material may have a composition different from that of the second inorganic material. The first inorganic material may have a lower refractive index than the second inorganic material. In an embodiment, the capping layer may include a plurality of layers having a different refractive index with each other. For example, two layers having a different refractive index with each other (e.g., a layer including a material having a high refractive index and a layer including a material having a relatively low refractive index) may be alternately laminated.

The first inorganic material may include a silicon oxide. The second inorganic material may include a hafnium oxide, a tantalum oxide, a titanium oxide, a zirconium oxide, a magnesium oxide, a cesium oxide, a lanthanum oxide, an indium oxide, a niobium oxide, an aluminum oxide, a silicon nitride, or a combination thereof.

In the multi-layered capping layer, a thickness of each layer and the number of layers may be determined considering a refractive index or a reflection wavelength of each layer, and a thickness of the first layer may be from about 3 nm to about 300 nm and a thickness of the second layer may be from about 3 nm to about 300 nm. The thickness of the first layer may be greater than the thickness of the second layer. The thickness of the first layer may be smaller than the thickness of the second layer.

A total thickness of the capping layer may be greater than or equal to about 100 nm, for example, greater than or equal to about 200 nm, or greater than or equal to about 300 nm. A total thickness of the capping layer may be less than or equal to about 10000 nm, less than or equal to about 8000 nm, less than or equal to about 6000 nm, less than or equal to about 5000 nm, less than or equal to about 400 nm, or less than or equal to about 3000 nm.

The capping layer may have a transmittance of greater than or equal to about 90%, for example, greater than or equal to about 95%, greater than or equal to about 96%, greater than or equal to about 97%, greater than or equal to about 98%, or greater than or equal to about 99% for light having a wavelength of greater than or equal to about 380 nm and less than or equal to about 520 nm (e.g., less than or equal to about 510 nm, less than or equal to about 500 nm, less than or equal to about 490 nm, or less than or equal to about 480 nm).

A layered structure according to an embodiment may include for example an overcoat layer on the capping layer so as to realize planarization. The overcoat layer may include an organic polymer. The organic polymer may include any optically transparent polymer, but is not particularly limited. For example, the organic polymer may be a thermosetting resin and an ultraviolet ("UV") curable resin. The thermosetting resin and ultraviolet ("UV") curable resin for the overcoat layer ("OCL") may include a urethane (meth)acrylate resin, a perfluoropolymer having a (meth)acrylate group, poly(meth)acrylate having a (meth) acrylate group, an epoxy(meth) acrylate polymer, or a combination thereof. A thickness of the overcoat layer is not particularly limited and may be appropriately selected. For example, the thickness of the overcoat layer may be different in accordance with a thickness or planarity of a color filter, and may be less than or equal to about 5 μm, for example, less than or equal to about 4 μm, or less than or equal to about 3 μm, but is not limited thereto. The thickness of the overcoat layer may be greater than or equal to about 10 nm, greater than or equal to about 50 nm, greater than or equal to about 80 nm, or greater than or equal to about 100 nm but is not limited thereto.

According to an embodiment, the layered structure may show an improved light conversion maintenance ratio after a heat treatment at an increased temperature (e.g., greater than or equal to about 160° C., even greater than or equal to about 180° C., or greater than or equal to about 200° C.). In addition, the layered structure according to an embodiment may show not a deteriorated but maintained or even increased light conversion maintenance ratio when excited by light under a severe environment (e.g., a temperature of about 65° C. and relative humidity of about 85%) after the heat treatment.

In an embodiment, a method of producing the layered structure includes applying a composition (hereinafter, also referred to as a photosensitive composition) including a plurality of quantum dots, a photopolymerizable compound including at least two polymerizable moieties, a linear polymer having a carboxylic acid group-containing repeating unit (e.g., a binder), a photoinitiator, and an organic solvent (for example, on a transparent substrate) to form a film;

exposing a predetermined region of the formed film to light (for example having a wavelength of less than 410 nm) to perform a cross-linking polymerization in an exposed region and to form a quantum dot polymer composite including the plurality of quantum dots dispersed in a polymer matrix;

removing an unexposed region from the film using an alkali aqueous solution to obtain a quantum dot-polymer composite pattern;

forming a capping layer including an inorganic material on the quantum dot-polymer composite pattern (for example, after removing the unexposed region); and heating the quantum dot-polymer composite pattern at a temperature of greater than or equal to about 160° C. after forming the capping layer including the inorganic material.

In the method, the series of the processes may be repeated at least twice so that the quantum dot polymer composite pattern of the photoluminescent layer may have a plurality of sections (e.g., a first section, a second section, or optionally a third section).

The quantum dot, the photopolymerizable compound, the carboxylic acid polymer (binder), the transparent substrate, the polymer matrix, the quantum dot-polymer composite, and the capping layer may be the same as explained above.

The composition includes a photoinitiator. Types of the photoinitiator are not particularly limited, and may be selected appropriately. For example, the available photoinitiator may include a triazine-based compound, an acetophenone-based compound, a benzophenone-based compound, a thioxanthone-based compound, a benzoin-based compound, an oxime-based compound, or a combination thereof, but it is not limited thereto.

Examples of the triazine-based compound may include 2,4,6-trichloro-s-triazine, 2-phenyl-4,6-bis(trichloro methyl)-s-triazine, 2-(3',4'-dimethoxy styryl)-4,6-bis (trichloro methyl)-s-triazine, 2-(4'-methoxy naphthyl)-4,6-bis(trichloro methyl)-s-triazine, 2-(p-methoxy phenyl)-4,6-bis(trichloro methyl)-s-triazine, 2-(p-tolyl)-4,6-bis(trichloro methyl)-s-triazine, 2-biphenyl-4,6-bis(trichloro methyl)-s-triazine, 2,4-bis(trichloro methyl)-6-styryl-s-triazine, 2-(naphthol-yl)-4,6-bis(trichloro methyl)-s-triazine, 2-(4-methoxy naphthol-yl)-4,6-bis(trichloro methyl)-s-triazine, 2,4-bis(trichloro methyl)-6-(piperonyl)-s-triazine, or 2,4-bis (trichloro methyl)-6-(4'-methoxy styryl)-s-triazine but it is not limited thereto.

Examples of the acetophenone-based compound may be 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, but are not limited thereto.

Examples of the benzophenone-based compound may be benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, but are not limited thereto.

Examples of the thioxanthone-based compound may be thioxanthone, 2-methyl thioxanthone, 2-isopropyl thioxanthone, 2,4-diethyl thioxanthone, 2,4-diisopropyl thioxanthone, 2-chloro thioxanthone, and the like, but are not limited thereto.

Examples of the benzoin-based compound may include benzoin, benzoin methyl ether, benzoin ethyl ether, benzoin isopropyl ether, benzoin isobutyl ether, or benzyl dimethyl ketal, but are not limited thereto.

Examples of the oxime-based compound may include 2-(o-benzoyloxi me)-1-[4-(phenylthio)phenyl]-1,2-octandione and 1-(o-acetyloxime)-1-[9-ethyl-6-(2-methylbenzoyl)-9H-carbazol-3-yl]ethanone, but are not limited thereto.

The photoinitiator may also be a carbazole-based compound, a diketone compound, a sulfonium borate-based compound, a diazo-based compound, a biimidazole-based compound, and the like, in addition to the photoinitiator.

The composition may include a solvent. The solvent may be appropriately selected considering affinity for other components in the composition (e.g., a carboxylic acid polymer, a photopolymerizable compound, a photoinitiator, other additives, and the like), affinity for an alkali developing solution, a boiling point, and the like. The composition may include the solvent in a balance amount except for the amounts of desired solids (non-volatile powder).

Non-limiting examples of the solvent may include ethylene glycols such as ethylene glycol, diethylene glycol, or polyethylene glycol; glycolethers such as ethylene glycolmonomethylether, ethylene glycolmonoethylether, diethylene glycolmonomethylether, ethylene glycoldiethylether, or diethylene glycoldimethylether; glycol ether acetates such as ethylene glycol monomethyl ether acetate, ethylene glycolmonoethyletheracetate, diethylene glycolmonoethyletheracetate, or diethylene glycolmonobutyletheracetate; propylene glycols such as propylene glycol; propylene glycolethers such as propylene glycolmonomethylether, propylene glycolmonoethylether, propylene glycolmonopropylether, propylene glycolmonobutylether, propylene glycoldimethylether, di propylene glycoldimethylether, propylene glycoldiethylether, or dipropylene glycoldiethylether; propylene glycoletheracetates such as propylene glycolmonomethyl ether acetate, or dipropylene glycolmonoethyletheracetate; amides such as N—methylpyrrolidone, dimethyl formamide, dimethyl acetamide; ketones such as methylethylketone ("MEK"), methylisobutylketone ("MIBK"), or cyclohexanone; petroleums such as toluene, xylene, or solvent naphtha; esters such as ethyl 3-ethoxy propionate, ethyl acetate, butyl acetate, or ethyl lactate; ethers such as diethyl ether, dipropyl ether, dibutyl ether, or a mixture thereof.

If desired, the photosensitive composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide, or zinc oxide particulates, and metal particles such as gold, silver, copper, or platinum, but is not limited thereto. A particle size of the light diffusing agent may be greater than or equal to about 30 nm, for example, greater than or equal to about 50 nm and less than or equal to about 1000 nm, for example, less than or equal to about 500 nm, less than or equal to about 400 nm, or less than or equal to about 300 nm, but is not limited thereto.

The leveling agent may prevent stains or spots and improve planarization and leveling characteristics of a film, and examples thereof may include the following but are not limited thereto.

A fluorine-based leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON 5-112®, SURFLON S—113®, SURFLON S—131®, SURFLON S—141®, and SURFLON S—145® of Asahi Glass Co., Ltd.; and SH-28PA®, SH-190®, SH-193®, SZ-6032®, SF-8428 and the like of Toray Silicone Co., Ltd.

The coupling agent may increase adherence with respect to the substrate and examples thereof may include a silane-based coupling agent. Examples of the silane-based coupling agent may be vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like.

Amounts of each component in the composition are not particularly limited and may be adjusted as necessary. For example, the composition may include
  about 1 weight % (wt %) to about 40 wt % of the quantum dot;
  about 0.5 wt % to about 35 wt % of the carboxylic acid polymer;
  about 0.5 wt % to about 30 wt % of the photopolymerizable compound;
  optionally about 0.1 wt % to about 40 wt % of the thiol compound; and
  about 0.01 wt % to about 10 wt % of the photoinitiator; and
  a balance amount of the solvent
  based on a total weight of the composition, but is not limited thereto.

A content of the quantum dot including the organic ligand may be greater than or equal to about 1 wt %, for example, greater than or equal to about 5 wt %, or greater than or equal to about 10 wt % based on a total weight of the composition. A content of the quantum dot including the organic ligand may be less than or equal to about 40 wt %, for example, less than or equal to about 35 wt % based on a total weight of the composition. In an embodiment, a content of the quantum dot including the organic ligand may be about 1.5 wt % to about 60 wt % based on a total weight of solid contents (i.e., non-volatile components for example, the quantum dot polymer composite) of the composition.

The composition may further include the additive, and kinds and contents thereof may be controlled within an appropriate range wherein the additive does not cause an adverse effect on the composition and the pattern, are not particularly limited.

In the composition, a plurality of quantum dots are dispersed (e.g., separated from one another) by the carboxylic acid polymer to form quantum dot dispersion. Accordingly, the composition may include quantum dot dispersion and the quantum dot dispersion may include a plurality of quantum dots dispersed in the carboxylic acid polymer and the carboxylic acid polymer. The quantum dot dispersion may further include a solvent.

A method of producing the composition includes preparing a binder solution including the carboxylic acid polymer and the solvent; dispersing the plurality of quantum dots in the binder solution to obtain quantum dot-binder dispersion; and mixing the quantum dot-binder dispersion with at least one of the thiol compound; the photoinitiator; the photopolymerizable monomer and the solvent. A mixing manner is not particularly limited, and may be appropriately selected. For example, each component may be mixed sequentially or simultaneously.

The method of producing the composition may further include selecting quantum dots including an organic ligand (e.g., having a hydrophobic moiety) on the surface, and selecting a carboxylic acid polymer capable of dispersing the quantum dots. In the selecting the carboxylic acid polymer, a chemical structure and an acid value of a corresponding polymer may be considered. In order to disperse quantum dots, the carboxylic acid polymer may have an acid value of greater than or equal to about 50 mg KOH/g which may be different depending on a chemical structure (e.g., chemical structures of a binder backbone or a hydrophobic moiety at a side chain) of the polymer For example, the carboxylic acid polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, or greater than or equal to about 110 mg KOH/g. The carboxylic acid polymer may have for example an acid value of less than or equal to about 250 mg KOH/g, less than or equal to about 230 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The quantum dots may be mixed in a solution including the binder having an acid value within the ranges to form quantum dot-binder dispersion, the formed quantum dot-binder dispersion may exhibit improved compatibility with other components in the composition for forming the photoluminescent layer (e.g., photopolymerizable compound, photoinitiator, solvent, etc.) and thus the quantum dots may be dispersed so that they may form a pattern in the final composition (i.e., the composition for forming the photoluminescent layer).

The composition may be coated on a transparent substrate by an appropriate manner (e.g., spin coating) to form a film. The formed film may be subjected to pre-baking as needed. The pre-baking may be performed at a temperature of less than or equal to about 130° C., for example, about 90° C. to about 120° C. A time of the pre-baking is not particularly limited and may be appropriately selected. For example, the pre-baking may be performed for greater than or equal to about 1 minute and less than or equal to about 60 minutes, but is not limited thereto. The pre-baking may be performed under a predetermined atmosphere (e.g., air, oxygen-free atmosphere, inert gas atmosphere), is not particularly limited thereto.

In the exposed region, cross-linking polymerization may occur to form a quantum dot polymer composite having the plurality of the quantum dots dispersed in the polymer matrix. The resulting film may be treated with an alkali aqueous solution to remove the unexposed region from the film and to obtain a pattern of the quantum dot polymer composite. The photosensitive composition may be developable by an alkali aqueous solution, and when the photosensitive composition is used, a pattern of the quantum dot-polymer composite may be formed without using an organic solvent developing solution.

Figure 4:
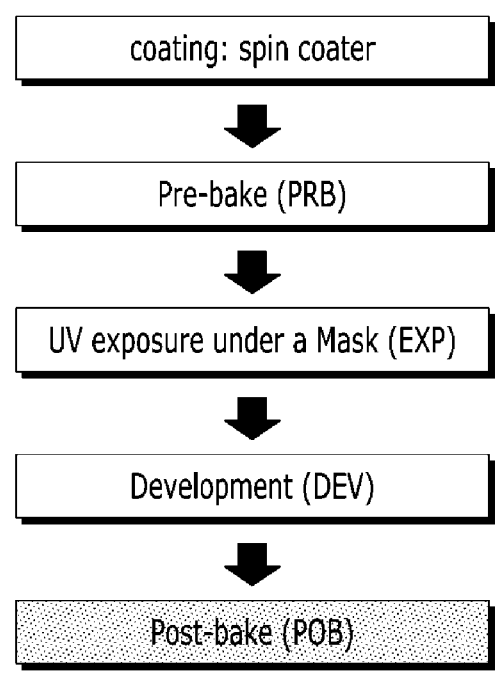
FIG. 4 is a view showing an embodiment of a process of forming a photoluminescent layer including a quantum dot-polymer composite pattern on a substrate in a layered structure.

A non-limiting method of forming a pattern is explained referring to FIG. 4. The composition may be coated on a predetermined substrate (e.g., a glass substrate or a glass substrate coated with a predetermined thickness of SiNx (protective layer) (e.g., about 500 Å to about 1500 Å of the protective layer)) in an appropriate manner such as spin coating or slit coating to form a film of a predetermined thickness (e.g., a thickness of about 3 μm to about 30 μm). The formed film may be pre-baked, if desired. The formed (or optionally pre-baked) film may be exposed to light having a predetermined wavelength under a mask having a predetermined pattern. A wavelength and intensity of the light may be selected considering kinds and contents of the photoinitiator, kinds and contents of the quantum dots, and the like.

The exposed film may be treated (e.g., dipped or sprayed) with an alkali developing solution and thus an unexposed part of the film may dissolve to form the quantum dot polymer composite pattern.

After removing the unexposed region, a capping layer including an inorganic material may be formed on the predetermined region as exposed to light (e.g., on the quantum dot polymer composite pattern). Before forming the capping layer, the predetermined region as exposed to light (e.g., the patterned region) may be heat-treated at a temperature of greater than or equal to (the organic solvent's boiling point −10° C.) (e.g., greater than or equal to about a boiling point of the organic solvent) and less than about 160° C. (e.g., when the organic solvent is propylene glycol methyl ether acetate ("PGMEA"), the temperature may be in a range of about 145° C. to about 152° C.) (hereinafter, also referred to as "an inter POB" process).

Details of the inorganic material and the capping layer may be the same as set forth above. A formation of the capping layer may be performed by physical vapor deposition, chemical vapor deposition, or a combination thereof. Specific conditions for the forming process of the capping layer may be different depending on kinds of the inorganic material.

The physical vapor deposition may be performed by a thermal vacuum method, a sputtering method, and/or an electron beam method. The physical vapor deposition may be performed by a commercially available apparatus and a known method considering kinds of an inorganic material and a structure/thickness of the capping layer. An atmosphere, a temperature, a target material, and a vacuum degree of the deposition may be appropriately selected and is not particularly limited. A manner of the chemical vapor deposition is not particularly limited and may be appropriately selected. The chemical vapor deposition may be performed by manners of normal pressure CVD, low pressure CVD, ultra high vacuum CVD, plasma CVD, and the like, but is not limited thereto. The chemical vapor deposition may be performed by a commercially available apparatus and a known method considering kinds of an inorganic material and a structure/thickness of the capping layer. An atmosphere, a temperature, kinds of gases, and a vacuum degree of the deposition may be appropriately selected and is not particularly limited.

The capping layer may be formed on the formed quantum dot polymer composite pattern mainly in order to protect and shield the quantum dot from moisture. In some embodiments, the formation of the capping layer includes deposition with using a thin film process equipment. When a physical vapor deposition (hereinafter, referred to as PVD) equipment is used, the capping layer may be formed at room temperature. In some embodiments, alternating deposition of different materials may be conducted in order to realize smaller reflectance and minimize the occurrence of defects. During the alternating deposition, the thickness of each layer may be dependent on an optical design value, and the optimized thickness may be determined considering the minimization of the reflectance. The optical design value indicates, for example, a combination of optical thicknesses. The thickness for the minimized reflectance may be obtained through an optical simulation by using a commercially available program, for example, Essential Macleod and the like. In case of the multilayered capping layer, a total number of the layers may be greater than or equal to about two (2) and less than or equal to about 10. In the case of using a chemical vapor deposition ("CVD") equipment, the deposition may be performed at a temperature of about 120° C. to about 180° C. The deposition manner, e.g., conditions, may be substantially the same as or similar to those for the PVD.

The method may include heat-treating the layered structure at greater than or equal to about 160° C. and less than or equal to about 250° C. or for example less than or equal to about 240° C. (e.g., a temperature of about 160° C. to about 230° C.) (hereinafter, referred to as a post-baking process or a POB process) after the deposition (or the formation) of the capping layer. The post-baking process may improve resistance against crack and against a solvent of the quantum dot polymer composite pattern. Duration for the post-baking may be selected appropriately without particular limitation. For example, the post-baking process may be carried out for a time greater than or equal to about 5 minutes, for example, greater than or equal to about 10 minutes or greater than or equal to about 20 minutes but is not limited thereto. For example, the post-baking process may be performed for less than or equal to about 60 minutes, for example, less than or equal to about 40 minutes or less than or equal to about 35 minutes but is not limited thereto.

In some embodiments, the layered structure may exhibit improved stability such that it may maintain its photoconversion efficiency at a level of greater than or equal to about 90% of the initial photoconversion efficiency, even after the post-baking process. Accordingly, the layered structure of some embodiments may either show substantially no decrease in the photoconversion efficiency or exhibit an increased photoconversion efficiency under a predetermined environment (e.g., when it is irradiated with excitation light at a temperature of about 65° C. and under a relative humidity of about 85%).

When the layered structure is used as a color filter, two or three types of photosensitive compositions including red light emitting quantum dots, green light emitting quantum dots, (or optionally, blue light emitting quantum dots) may be prepared, and the patterning process may be repeated necessary times (e.g., at least twice or three times) for each composition.

In an embodiment, an electronic device includes the layered structure. The electronic device may be a photoluminescent liquid crystal display. The liquid crystal display may include a liquid crystal panel including a lower substrate, an upper substrate, a liquid crystal layer disposed between the upper and lower substrates, and a photoluminescent color filter layer provided on the upper substrate; a polarizer disposed under the lower substrate; and a backlight unit disposed under the polarizer and emitting blue light, wherein the photoluminescent color filter layer includes the layered structure.

Figure 5:
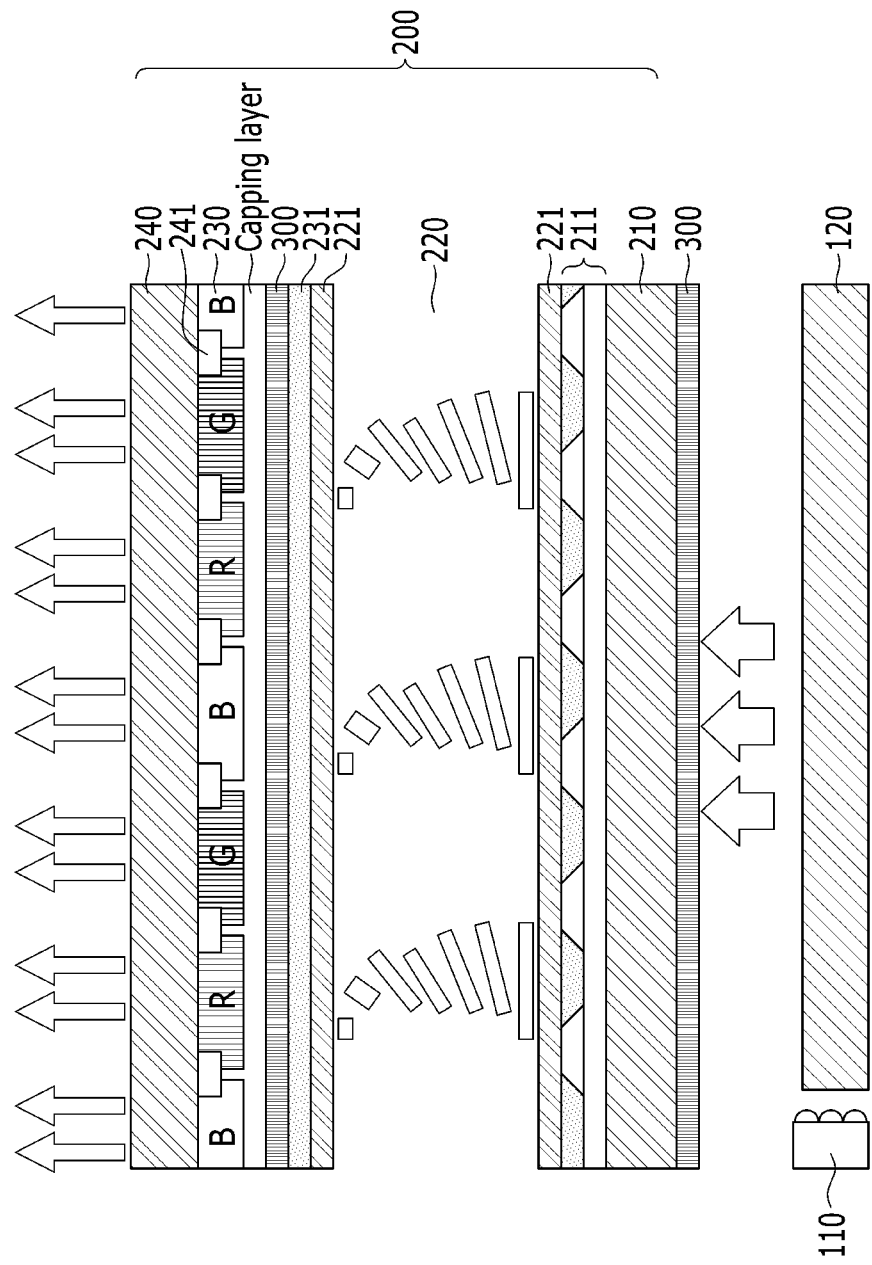
FIG. 5 is a cross-sectional view showing an embodiment of a liquid crystal display.

FIG. 5 is a cross-sectional view showing a liquid crystal display according to an embodiment. Referring to FIG. 5, a photoluminescent liquid crystal display device comprises a liquid crystal panel 200, a lower polarizer 300 disposed under the liquid crystal panel 200, and a backlight unit ("BLU") disposed under the lower polarizer 300. The backlight unit includes (e.g., blue) light source 110. The backlight unit may further include a light guide panel 120. The backlight unit may not include a light guide panel.

The liquid crystal panel 200 includes a lower substrate 210, an upper substrate 240, a liquid crystal layer 220 disposed between the upper and lower substrates, and a photoluminescent color filter layer provided on the upper substrate. The photoluminescent color filter layer includes a photoluminescent layer including a pattern of a quantum dot polymer composite; and a capping layer disposed on the photoluminescent layer and including an inorganic material.

The lower substrate 210, also referred to as an array substrate, may be a transparent insulation material substrate (e.g., a glass substrate, a polymer substrate including a polyester such as polyethylene terephthalate ("PET") or polyethylene naphthalate ("PEN"), polycarbonate, and/or a polyacrylate, inorganic material substrate of a polysiloxane, $Al_2O_3$, or ZnO. A wire plate 211 may be disposed on the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 may be provided under the lower substrate. Materials and structures of the lower polarizer 300 are known and are not particularly limited. A backlight unit (e.g., emitting blue light) may be disposed under the lower polarizer 300. An upper optical element such as an upper polarizer 300 may be disposed on the upper substrate, for example, provided between the liquid crystal layer 220 and the upper substrate 240, in particular, between the liquid crystal layer 220 and the photoluminescence color filter, but is not limited thereto. The polarizer may be any polarizer that used in a liquid crystal display device. The polarizer may be triacetyl cellulose ("TAO") having a thickness of less than or equal to about 200 μm, but is not limited thereto. In an alternative embodiment, the upper optical element may be a coating that controls a refractive index without a polarization function.

The backlight unit includes a light source emitting blue light. In an embodiment, the backlight unit may be an edge-type lighting. For example, the backlight unit may include a reflector (not shown), a light guide (not shown) provided on the reflector and providing a planar light source with the liquid crystal panel 200, and/or at least one optical sheet (not shown) on the light guide, for example, a diffusion plate, a prism sheet, and the like, but is not limited thereto.

In an embodiment, the backlight unit may be a direct lighting. For example, the backlight unit may have a reflector (not shown), and may have a plurality of fluorescent lamps disposed on the reflector at regular intervals, or may have a light-emitting diode ("LED") operating substrate on which a plurality of LEDs may be disposed, a diffusion plate thereon, and optionally at least one optical sheet.

Details (e.g., each components of light guide and various optical sheets, a reflector, and the like) of such a backlight unit are known and are not particularly limited.

The upper substrate 210 may be the transparent substrate. A black matrix 241 may be provided under the upper substrate and may have an opening and hides the gate line, the data line, and the thin film transistor of the wire plate on the lower substrate. For example, the black matrix 241 may have a lattice shape. In openings of the black matrix 241, a photoluminescent layer 230 including a first section (R)

configured to emit light (e.g., red light) in a first peak wavelength, a second section (G) configured to emit light (e.g., green light) in a second peak wavelength, and a third section (B) configured to emit or transmit for example blue light may be provided. If desired, the photoluminescent color filter layer may further include at least one of a fourth section. The fourth section may include a quantum dot emitting a light of different colors (e.g., cyan, magenta, and yellow) from the light emitted from the first to third sections.

In the photoluminescent layer 230, sections forming a pattern may be repeated corresponding to pixel areas formed on the lower substrate. A transparent common electrode 231 may be provided on the photoluminescent color filter layer.

The third section (B) configured to emit or transmit blue light may be a transparent color filter that does not change a light emitting spectrum of the light source. In this case, blue light emitted from the backlight unit may pass the polarizer and the liquid crystal layer to become a polarized state, then enter the third section (B) in a polarized state, and may be go out of the third section (B) as it is. If needed, the third section may include quantum dots emitting blue light.

If needed, the photoluminescent liquid crystal display device may further have a blue light blocking layer (blue cut filter). The blue light blocking layer (e.g., a blue cut filter) may be disposed between lower surfaces of the first section (R) and the second section (G) and the upper substrate 240 or on the upper substrate (not shown). The blue light blocking layer may include a sheet having an opening in a region corresponding to a pixel area (a third section) displaying blue and thus formed in a region corresponding to first and second sections. In an embodiment, the blue light blocking layer may be formed by alternately stacking at least two layers having different refractive indexes and thus may block light in a blue wavelength region but transmit light in the other wavelength regions. The blocked blue wavelength light may be reflected and recycled. The blue light blocking layer may play a role of blocking light emitted from a blue light source 110 from being directly emitted outside.

EXAMPLES

Measurement Method:

A photoconversion efficiency and a maintenance ratio are obtained in the following method:

[1] A blue light photoconversion efficiency of a quantum dot polymer composite film is obtained by the following procedures. The prepared quantum dot polymer composite is inserted between a light guide and an optical sheet of a 60 inch television ("TV") equipped with blue LED having a peak wavelength of 449 nm. The TV is operated and light emitting properties are analyzed with a spectroradiometer (CS-2000, Konica Minolta Co.) 45 cm away therefrom and a spectrum of light emitted therefrom is obtained. The light emitting spectrum is used to calculate the photoconversion efficiency.

[2] A maintenance ratio is a ratio of a photoconversion efficiency after the process relative to a photoconversion efficiency before the process.

Reference Example 1: Preparation of (Green light-emitting or Red light-emitting) Non-cadmium Quantum Dot (1) 0.2 mmol of indium acetate, optionally 0.1 mmol of zinc oleate, 0.6 mmol of palmitic acid, and 10 milliliters (mL) of 1-octadecene are put in a reactor and heated at 120° C. under vacuum. After 1 hour, an atmosphere in the reactor is replaced with nitrogen. The reactor is heated at 280° C., a mixed solution of tris(trimethylsilyl)phosphine ("TMS3P", 0.1 mmol) and trioctylphosphine (0.5 mL) is rapidly injected thereinto, and the mixture is reacted for 20 minutes. Subsequently, acetone is added to the reaction solution rapidly cooled down to room temperature, and a precipitate obtained by centrifuging the mixture is dispersed in toluene to obtain the InP or InZnP core nanocrystals.

0.3 mmol (0.056 g) of zinc acetate, 0.6 mmol (0.189 g) of oleic acid, and 10 mL of trioctylamine are put in a reaction flask and vacuum-treated at 120° C. for 10 minutes. The reaction flask is heated up to 220° C. after substituting inside of the reaction flask with $N_2$. After the toluene dispersion of the InP semiconductor nanocrystal (OD: 0.15) and 0.6 mmol of S/TOP (sulfur dissolved or dispersed in trioctyl phosphine) are added to the reaction flask, the obtained mixture is heated up to 280° C. and reacted for 30 minutes. When the reaction is complete, the reaction solution is rapidly cooled down to room temperature to obtain a reactant including the (red-light emitting) InP/ZnS or (green light emitting) InZnP/ZnS semiconductor nanocrystal.

(2) An excessive amount of ethanol is added to the reactant including the InP/ZnS semiconductor nanocrystal, and the mixture is centrifuged. After the centrifuging, a supernatant is removed, and a precipitate therein is dried and dispersed in chloroform or toluene to obtain a quantum dot solution (hereinafter, a QD solution). A UV-vis absorption spectrum of the QD solution is measured. The quantum dot had a quantum efficiency of greater than or equal to 50% (50% to 100%).

Example 1

[1] Preparation of Quantum Dot-Binder Dispersion

A chloroform dispersion of the quantum dots (InP/ZnS core-shell, green light emitting) including oleic acid as a hydrophobic organic ligand on a surface thereof synthesized in Reference Example 1 is prepared. The chloroform dispersion including 50 grams (g) of the quantum dots is mixed with 100 g of a binder (a four-membered copolymer of methacrylic acid, benzyl methacrylate, hydroxyethylmethacrylate, and styrene (a mole ratio=61.5%:12%:16.3%: 10.2%), an acid value: 130 mg KOH/g, a number average molecular weight: 8000 g/mol) solution (solvent: polypropylene glycol monomethyl ether acetate having a concentration of 30 wt %) to prepare a quantum dot-binder dispersion. It is confirmed that the quantum dots are uniformly dispersed in the prepared quantum dot-binder dispersion.

[2] Preparation of Photosensitive Composition

To the quantum dot-binder dispersion prepared in [1], 100 g of hexaacrylate having the following structure as a photopolymerizable monomer, an oximeester compound as an initiator, 30 g of $TiO_2$ as a light diffusing agent (an average particle size: 200 nm), and 300 g of propylene glycol methyl ether acetate ("PGMEA") as a solvent is added to obtain a photosensitive composition.

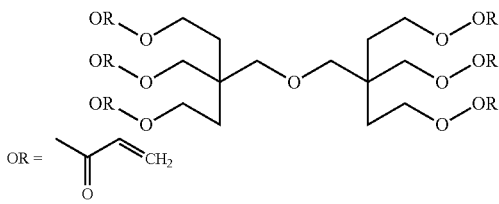

It is confirmed that the prepared composition may form dispersion without showing any noticeable agglomeration due to the addition of the quantum dots.

[3] Formation of Quantum Dot—Polymer Composite Pattern

The photosensitive composition obtained from [2] is spin-coated on a glass substrate at 150 rpm for 5 seconds to provide a film. The obtained film is pre-baked ("PRB") at 100° C. A blue photoconversion efficiency of the pre-baked film is measured, and the results are compiled in Table 1. The pre-baked film is radiated by light (a wavelength: 365 nm, intensity: 100 millijoule (mJ)) for 1 second under a mask having a predetermined pattern (e.g., a square dot or stripe pattern) and developed by a potassium hydroxide aqueous solution (a concentration: 0.043%) for 50 seconds to provide a quantum dot-polymer composite pattern.

[4] Formation of Capping Layer and POB Treatment

The pattern is subjected to an inter POB heat treatment at 140° C. for 10 minutes to measure a blue photoconversion efficiency. The results are compiled in Table 1.

On the inter POB heat-treated pattern, a capping layer (a thickness: 400 nm) including titanium dioxide is formed through sputtering (sputtering temperature: room temperature, sputtering gas: argon+oxygen, target: titanium metal, purity: 99.999%), then, its blue photoconversion efficiency is measured again, and the results are compiled in Table 1.

The layered structure including the capping layer is POB heat treated at 180° C. for 30 minutes, and then, its blue photoconversion efficiency is measured. Subsequently, the layered structure is radiated by excited light having a wavelength of 449 nm at 65° C. under relative humidity of 85% for 24 hours (an aging treatment).

The results are compiled in Table 1.

Comparative Example 1

The quantum dot polymer composite pattern manufactured in the same method as Example 1 is POB heat treated at 180° C. for 30 minutes without performing the inter POB heat treatment and forming the capping layer. A blue photoconversion efficiency of the pattern is measured, and the results are shown in Table 1.

TABLE 1

| | Process | Photoconversion efficiency (%) | Maintenance ratio (%) |
|---|---|---|---|
| Example 1 | PRB | 32.4% | 100% |
| | Inter POB at 140° C. | 26.8% | 83% |
| | Formation of TiO$_2$ layer | 31.4% | 97% |
| | After POB | 31.9% | 99% |
| | Aging | 34.5% | 107% |
| Comparative Example 1 | After POB | 27.2% | 84% |

Referring to Table 1, the layered structure of Example exhibited almost no light characteristic deterioration due to a heat treatment, but the pattern of Comparative Example 1 exhibited substantial light characteristic deterioration due to the heat treatment.

Example 2

A quantum dot-polymer composite pattern is obtained according to the same method as Example 1 except for using a chloroform dispersion of quantum dots (InP/ZnS core-shell, red light emitting) including oleic acid as a hydrophobic organic ligand on the surface. The pattern is inter POB heat treated at 140° C. for 30 minutes, and its blue photoconversion efficiency is measured. The results are compiled in Table 2. A capping layer (thickness: 400 nm) is formed on the inter POB heat treated pattern in the same method as Example 1, and its blue photoconversion efficiency is measured.

The layered structure having the capping layer is POB heat treated at 180° C. for 30 minutes, and its blue photoconversion efficiency is measured. Then, the layered structure is radiated by excited light having a wavelength of 449 nm at 65° C. under relative humidity of 85% for 24 hours (an aging treatment). The results are shown in Table 2.

Comparative Example 2

A quantum dot polymer composite pattern formed in the same method as Example 2 is POB heat treated at 180° C. for 30 minutes without performing the inter POB heat treatment and forming the capping layer. A (blue) photoconversion efficiency of the pattern is measured, and the results are compiled in Table 2.

TABLE 2

| | Process | Photoconversion efficiency (%) | Maintenance ratio (%) |
|---|---|---|---|
| Example 2 | PRB | 30.8% | 100% |
| | inter POB at 140° C. | 23.8% | 77% |
| | Formation of TiO$_2$ layer | 27.8% | 90% |
| | After POB | 28.8% | 93% |
| | Aging | 30.2% | 98% |
| Comparative Example 2 | After POB | 21.2% | 69% |

Referring to the results of Table 2, the layered structure of Example 2 exhibited almost no light characteristic deterioration due to a heat treatment, but the pattern of Comparative Example 2 exhibited substantial light characteristic deterioration due to the heat treatment.

Example 3

A quantum dot-polymer composite pattern is obtained according to the same method as Example 1 except for using 60 g of quantum dots (InP/ZnS core-shell, green light emitting) including oleic acid as a hydrophobic organic ligand on the surface. For each of the quantum dot-polymer composite patterns after pre-baking and light exposure & development, blue light photoconversion efficiency is measured. A TiO$_2$—containing capping layer (thickness: 400 nm) is formed on the pattern in the same method as Example 1 and then, post-baked at 180° C. for 30 minutes. A blue photoconversion efficiency of the layered structure is measured.

A polymer solution including urethane acrylate is spin-coated to form an overcoat layer on the TiO2—containing capping layer of the layered structure (CAP). The layered structure including the overcoat layer is heat-treated at 230° C. for 30 minutes and subsequently, radiated by excited light having a wavelength of 449 nm for 24 hours at 65° C. under relative humidity of 85% (aging treatment). A blue photoconversion efficiency of the layered structure after the heat treatment at 230° C. and the aging treatment is measured. The blue photoconversion efficiencies measured in each step are compiled in a graph of FIG. 6.

Comparative Example 3

Figure 6:
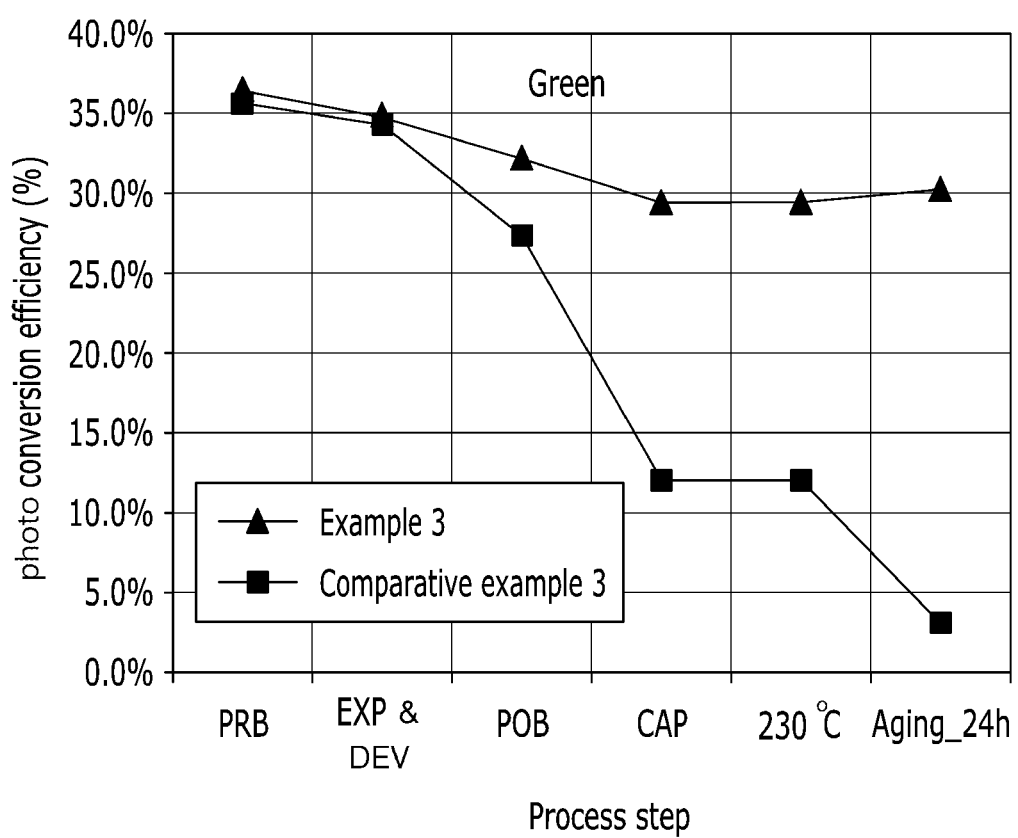
FIG. 6 is a graph showing changes of a blue photoconversion efficiency of the layered structure during a production process of the layered structure according to Example 3 and Comparative Example 3.

A layered structure is formed in the same method as Example 3 without a capping layer, and its blue photoconversion efficiencies in each step are compiled in a graph of FIG. 6.

The results of FIG. 6 suggest the following: the capping layer in the layered structure of Example 3 may suppress light emitting characteristic deterioration of a photoluminescent layer due to a contact of quantum dots with other layers (e.g., a planarization layer/an alignment layer included in a liquid crystal display) as well as prevent quantum dot photoluminescence characteristic deterioration due to a heat treatment.

Example 4

A quantum dot-polymer composite pattern is obtained according to the same method as Example 1 except for using 60 g of quantum dots (InP/ZnS core-shell, red light emitting) including oleic acid as a hydrophobic organic ligand on the surface. For each of the quantum dot-polymer composite patterns after pre-baking and light exposure and development, blue light photoconversion efficiency is measured. A $TiO_2$—containing capping layer (thickness: 400 nm) is formed on the pattern according to the same method as Example 1 and then, post-baked at 180° C. for 30 minutes. A blue photoconversion efficiency of the obtained layered structure is measured.

On the $TiO_2$—containing capping layer of the layered structure, an urethaneacrylate polymer solution is spin-coated to form an overcoat layer. The layered structure including the overcoat layer is heat-treated at 230° C. for 30 minutes and subsequently, radiated by excited light having a wavelength of 449 nm at 65° C. under relative humidity of 85% for 24 hours (aging treatment). A blue photoconversion efficiency of the layered structure after the heat treatment at 230° C. and the aging treatment is measured. The blue photoconversion efficiencies in each step are compiled in a graph of FIG. 7.

Comparative Example 4

Figure 7:
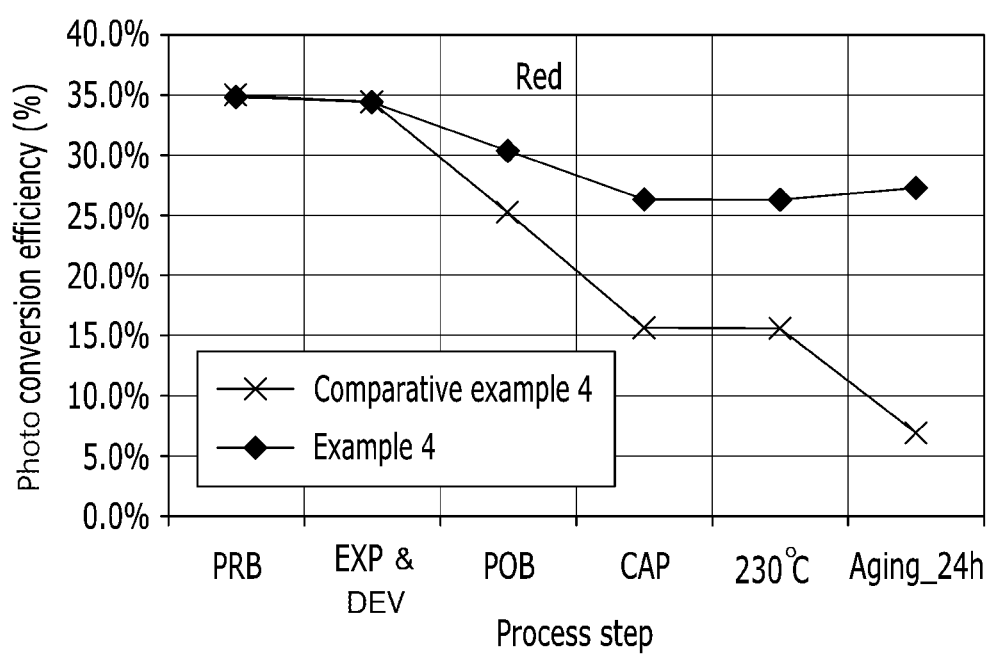
FIG. 7 is a graph showing changes of a blue photoconversion efficiency of the layered structure during a production process of the layered structure according to Example 4 and Comparative Example 4.

A layered structure is formed according to the same method as Example 4 without forming a capping layer, and its blue photoconversion efficiencies in each step are compiled in a graph of FIG. 7.

The results of FIG. 7 suggest the following: the capping layer in the layered structure of Example 4 may suppress light emitting characteristic deterioration of a photoluminescent layer due to a contact of quantum dots with other layers (e.g., a planarization layer/an alignment layer included in a liquid crystal display) as well as prevent quantum dot photoluminescence characteristic deterioration due to a heat treatment.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A layered structure comprising:
   A transparent substrate disposed on a surface of a photoluminescent layer comprising a pattern of a quantum dot polymer composite; and
   a capping layer directly disposed on an opposite surface of the photoluminescent layer, wherein the capping layer comprises at least two adjacent layers including a first layer in contact with the photoluminescent layer and comprising a first inorganic material having a first refractive index, and a second layer comprising a second inorganic material and having a second refractive index, wherein the second layer directly contacts the first layer, and the second refractive index has a refractive index that is at least 0.5 greater than the first refractive index, and
   wherein the capping layer is disposed between the photoluminescent layer and a liquid crystal display layer, and has a transmittance of greater than or equal to about 90% for a wavelength range of about 380 nanometers to about 520 nanometers,
   wherein the quantum dot polymer composite comprises a polymer matrix, and
   a plurality of quantum dots in the polymer matrix,
   wherein the pattern of the quantum dot polymer composite comprises a repeating section and wherein the repeating section comprises a first section configured to emit light of a first peak wavelength,
   wherein the first and the second inorganic materials are different, and comprise a metal oxide, a metal nitride, a metal oxynitride, a metal sulfide, or a combination thereof.

2. The layered structure of claim 1, wherein the polymer matrix comprises a cross-linked polymer and a linear polymer comprising a carboxylic acid group-containing repeating unit.

3. The layered structure of claim 2, wherein the cross-linked polymer comprises a thiol-ene resin, a cross-linked poly(meth)acrylate, a cross-linked polyurethane, a cross-linked epoxy resin, a cross-linked vinyl polymer, a cross-linked silicone resin, or a combination thereof.

4. The layered structure of claim 2, wherein the carboxylic acid group-containing repeating unit is derived from a monomer comprising a carboxylic acid group and a carbon-carbon double bond, a monomer comprising a dianhydride moiety, or a combination thereof.

5. The layered structure of claim 1, wherein the plurality of quantum dots comprise a Group II-VI compound, a Group III-V compound, a Group IV-VI compound, a Group IV element or a compound, a Group I-III-VI compound, a Group I-II-IV-VI compound, or a combination thereof.

6. The layered structure of claim 1, wherein the plurality of quantum dots do not comprise cadmium.

7. The layered structure of claim 1, wherein the plurality of quantum dots comprise a core-shell structure.

8. The layered structure of claim 1, wherein
   the plurality of quantum dots comprise an organic ligand on a surface of the plurality of quantum dots,
   wherein the organic ligand comprises RCOOH, $RNH_2$, $R_2NH$, $R_3N$, RSH, $R_3PO$, $R_3P$, ROH, RCOOR', RPO$(OH)_2$, $R_2POOH$, wherein R and R' are each independently a C5 to C24 substituted or unsubstituted aliphatic hydrocarbon group, or a C6 to C20 substituted or unsubstituted aromatic hydrocarbon group, a polymeric organic ligand, or a combination thereof.

9. The layered structure of claim 1, wherein the repeating section further comprises a second section configured to emit light of a second peak wavelength that is different from the first peak wavelength; a third section configured to emit or transmit light of a third peak wavelength that is different from the first peak wavelength and the second peak wavelength; or a combination thereof.

10. The layered structure of claim 9, wherein the first peak wavelength is greater than about 580 nanometers and less than or equal to about 680 nanometers, the second wavelength is greater than about 480 nanometers and less than or equal to about 580 nanometers, and the third peak wavelength is greater than or equal to about 380 nanometers and less than or equal to about 480 nanometers.

11. The layered structure of claim 10, wherein the second inorganic material is titanium or zirconium oxide.

12. The layered structure of claim 1, wherein the first and second inorganic materials each have a refractive index of about 1.4 to about 3.

13. The layered structure of claim 1, wherein the first inorganic material comprises a silicon oxide, and the second inorganic material comprises a hafnium oxide, a tantalum oxide, a titanium oxide, a zirconium oxide, a zinc oxide, a zinc sulfide, a magnesium oxide, a cesium oxide, a lanthanum oxide, an indium oxide, a niobium oxide, an aluminum oxide, or a combination thereof.

14. The layered structure of claim 1, wherein the capping layer comprises a continuous film of the inorganic material.

15. The layered structure of claim 1, wherein the at least two adjacent layers of the inorganic materials have a different thickness, a different transmittance, or a combination thereof.

16. The layered structure of claim 1, wherein a thickness of the capping layer is greater than or equal to about 100 nanometers and less than or equal to about 10000 nanometers.

17. The layered structure of claim 1, wherein the layered structure further comprises an overcoat comprising an organic polymer, wherein the overcoat is on the capping layer.

18. A liquid crystal display comprising:
a liquid crystal panel comprising a lower substrate, an upper substrate, a liquid crystal layer disposed between the upper and lower substrates, and the photoluminescent color filter layer comprising a layered structure of claim 1 proximate to the upper substrate, wherein the capping later is directly disposed on the photoluminescent color filter layer;
a polarizer disposed under the lower substrate; and
a backlight unit disposed under the polarizer and emitting blue light.

19. The liquid crystal display of claim 18, wherein the liquid crystal display further comprises an optical element between the photoluminescent color filter layer and the liquid crystal layer.

20. The liquid crystal display of claim 19, wherein the optical element comprises at least one of a polarizer and a coating that controls a refractive index without a polarization function.

21. The liquid crystal display of claim 18, wherein the repeating section further comprises a second section configured to emit light of a second peak wavelength that is different from the first peak wavelength.

22. The liquid crystal display of claim 21, wherein liquid crystal display further comprises a blue filter disposed on a region corresponding to at least one of the first section and the second section.

* * * * *